US008324671B2

(12) United States Patent
Dote et al.

(10) Patent No.: US 8,324,671 B2

(45) Date of Patent: Dec. 4, 2012

(54) SEMICONDUCTOR DEVICE AND METHOD OF MANUFACTURING THE SAME

(75) Inventors: Aki Dote, Kawasaki (JP); Kazutoshi Izumi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 371 days.

(21) Appl. No.: 12/068,912

(22) Filed: Feb. 13, 2008

(65) Prior Publication Data

US 2008/0197391 A1 Aug. 21, 2008

(30) Foreign Application Priority Data

Feb. 15, 2007 (JP) ................................ 2007-034219

(51) Int. Cl.
*H01L 29/92* (2006.01)

(52) U.S. Cl. .......... 257/295; 257/E29.342; 257/E21.664

(58) Field of Classification Search ........... 257/E21.664, 257/E21.665, 295, E29.342; 438/3
See application file for complete search history.

(56) References Cited

U.S. PATENT DOCUMENTS

| | | | | |
|---|---|---|---|---|
| 6,642,564 | B2 * | 11/2003 | Ogawa et al. | 257/296 |
| 7,115,994 | B2 | 10/2006 | Yaegashi | |
| 7,339,218 | B2 * | 3/2008 | Hidaka et al. | 257/295 |
| 7,402,858 | B2 * | 7/2008 | Hidaka et al. | 257/295 |
| 7,429,508 | B2 * | 9/2008 | Hidaka et al. | 438/239 |
| 7,446,362 | B2 * | 11/2008 | Hidaka et al. | 257/295 |
| 7,615,459 | B1 * | 11/2009 | Inoue et al. | 438/385 |
| 2003/0185068 | A1 * | 10/2003 | Saito et al. | 365/200 |
| 2004/0056294 | A1 * | 3/2004 | Ogawa et al. | 257/296 |
| 2005/0118795 | A1 * | 6/2005 | Hidaka et al. | 438/593 |
| 2005/0127395 | A1 | 6/2005 | Saigoh et al. | |
| 2005/0285173 | A1 | 12/2005 | Nagai et al. | |
| 2006/0033138 | A1 * | 2/2006 | Fukada | 257/296 |
| 2006/0157762 | A1 | 7/2006 | Hikosaka et al. | |
| 2006/0261387 | A1 * | 11/2006 | Izumi | 257/295 |
| 2006/0281300 | A1 | 12/2006 | Yaegashi | |
| 2008/0073684 | A1 * | 3/2008 | Hidaka et al. | 257/295 |
| 2008/0076192 | A1 * | 3/2008 | Hidaka et al. | 438/3 |
| 2008/0087928 | A1 | 4/2008 | Nagai | |
| 2008/0224194 | A1 * | 9/2008 | Sashida | 257/295 |

FOREIGN PATENT DOCUMENTS

| | | | |
|---|---|---|---|
| JP | 2005-159165 | A | 6/2005 |
| JP | 2006-49795 | | 2/2006 |
| JP | 2006-202848 | | 8/2006 |
| JP | 2008053264 | A * | 3/2008 |
| KR | 10-2005-0058182 | A | 6/2005 |
| WO | 2006134631 | A1 | 12/2006 |

OTHER PUBLICATIONS

Korean Office Action dated Oct. 30, 2009, issued in corresponding Korean Patent Application No. 10-2008-0012187.

Chinese Office Action dated Sep. 25, 2009, issued in corresponding Chinese Patent Application No. 2008100056444.

Japanese Office Action mailed Apr. 24, 2012 for corresponding Japanese Application No. 2007-034219, with Partial English-language Translation.

Japanese Office Action mailed Aug. 14, 2012 for corresponding Japanese Application No. 2007-034219, with English-language translation.

* cited by examiner

*Primary Examiner* — Allan R Wilson

(74) *Attorney, Agent, or Firm* — Fujitsu Patent Center

(57) ABSTRACT

A semiconductor device has a ferroelectric capacitor having a ferroelectric film, an interlayer insulating film having a first layer formed on the ferroelectric capacitor, a plug and a wiring connecting to the ferroelectric capacitor, and a dummy plug in the vicinity of the ferroelectric capacitor.

15 Claims, 25 Drawing Sheets

2
3
3a
3b
3c
3d
3e
3f
3g
4
4a
4b
4c
5
6
7
8
9
10
11

4a
31
4c
32
4
4b
12
11
32
4
4c
4b
4a 19
14
12
15
17
20
18
15
17
15
16
14
13

41c
41b
41a
40b
40a
40
41
40
40
40
40
X
Y
12
14
4
14
4
17c
17b
17a
17
22
19
14b
14a
4c
4b
4a
11
10
8

41
40
40
40
40
40
19
12
4
4
17
14
14
11
10
8

53c
53b
53a
50b
50a
53
50
51
50
51
12
14
4
17c
17b
17a
14
17
4
22
19
14b
14a
4c
4b
4a
11
10
8

10
8
11
51
51
4a
4b
4c
4
4
4c
4b
4a 74c
74b
74a
70
70b
70a
73
12
73c
73b
74
73a
70
73
70
70
14
17c
17b
17a
4
14
17
4
22
19
14b
14a
4c
4b
4a
11
10
8

22
19
14b
14a
4c
4b
4a
11
10
8
17
17a
17b
17c
12
14
4
80
40
40a
40b
41
41a
41b
41c 10
8
42
42
42
42
42
12
4
4
11

100
101
102
103
90
91
11
10
8
4
24
22
19
17
12

SEMICONDUCTOR DEVICE AND METHOD OF MANUFACTURING THE SAME

TECHNICAL FIELD

The present invention relates to a semiconductor device and a method of manufacturing the same, and in particular, to a semiconductor device including ferroelectric capacitors and a method of manufacturing the same.

BACKGROUND

Ferroelectric random access memories (FeRAMs) are non-volatile memories including ferroelectric capacitors having a ferroelectric film. FeRAMs are advantageous in that high-speed operation can be realized, electric power consumption is low, and they have excellent durability in writing and reading. An example of the ferroelectric film used for the ferroelectric capacitors of FeRAMs is a film of lead zirconate titanate ($PbZr_{1-x}$-$Ti_xO_3$, PZT)

Such a ferroelectric film, e.g., a PZT film, has a property that it is easily degraded by hydrogen and moisture. Hydrogen and moisture enter from the outside or they are generated during a process of forming the FeRAMs. Therefore, normal FeRAMs have a structure in which the ferroelectric capacitor portions are covered with an aluminum oxide (AlO) film or the like so as to prevent hydrogen and moisture from entering the ferroelectric capacitors (for example, see U.S. Pat. No. 7,115,994 and US 2006-0281300A).

SUMMARY

According to the present invention, there is provided a semiconductor device having a ferroelectric capacitor having a ferroelectric film, an interlayer insulating film having a first layer formed on the ferroelectric capacitor, a plug and a wiring connecting to the ferroelectric capacitor, and a dummy plug in the vicinity of the ferroelectric capacitor.

DETAILED DESCRIPTION OF THE PREFERRED EMBODIMENTS

Figure 1:
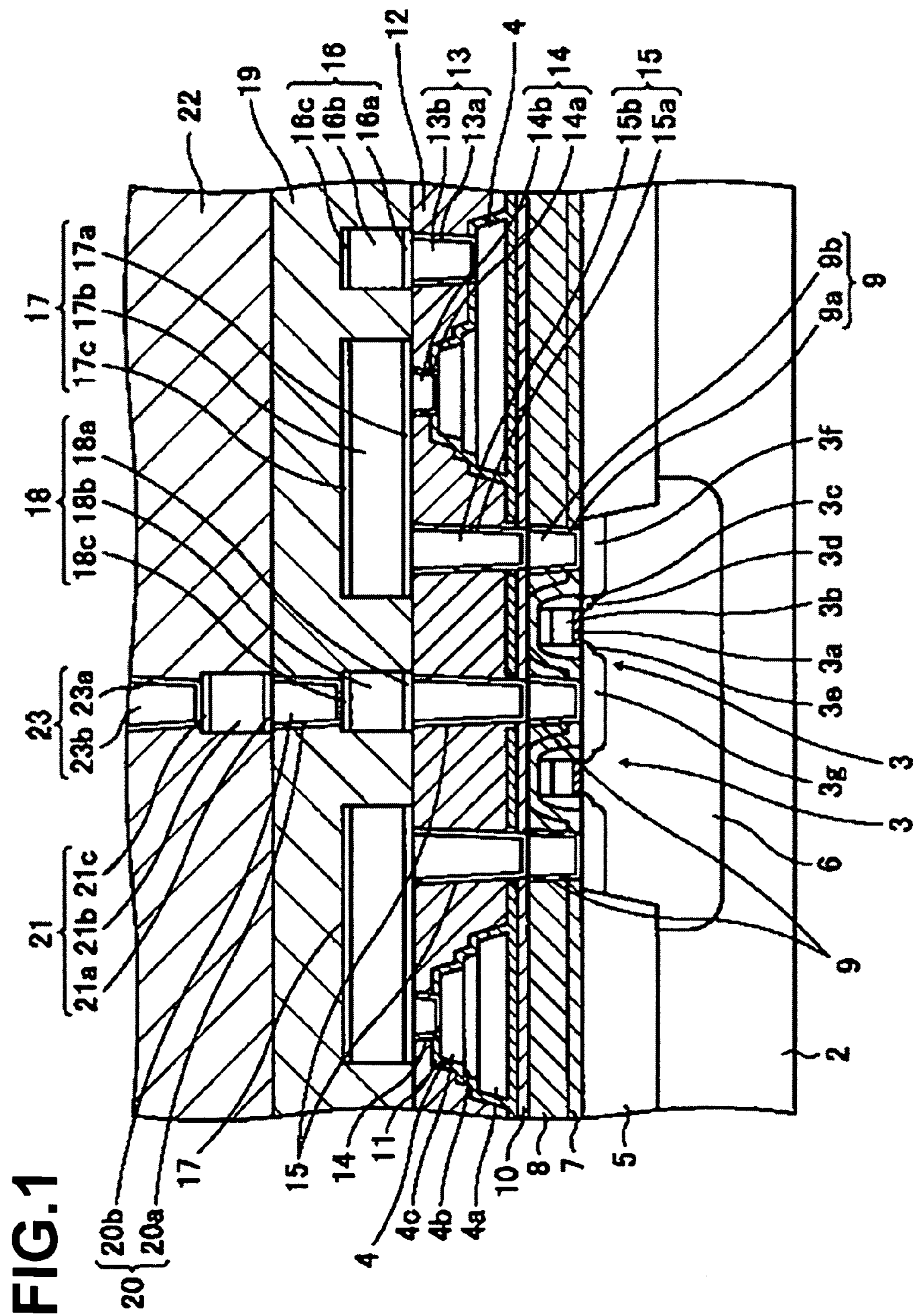
FIG. 1 is a schematic cross-sectional view of the relevant part of an FeRAM.
Figure 2A:
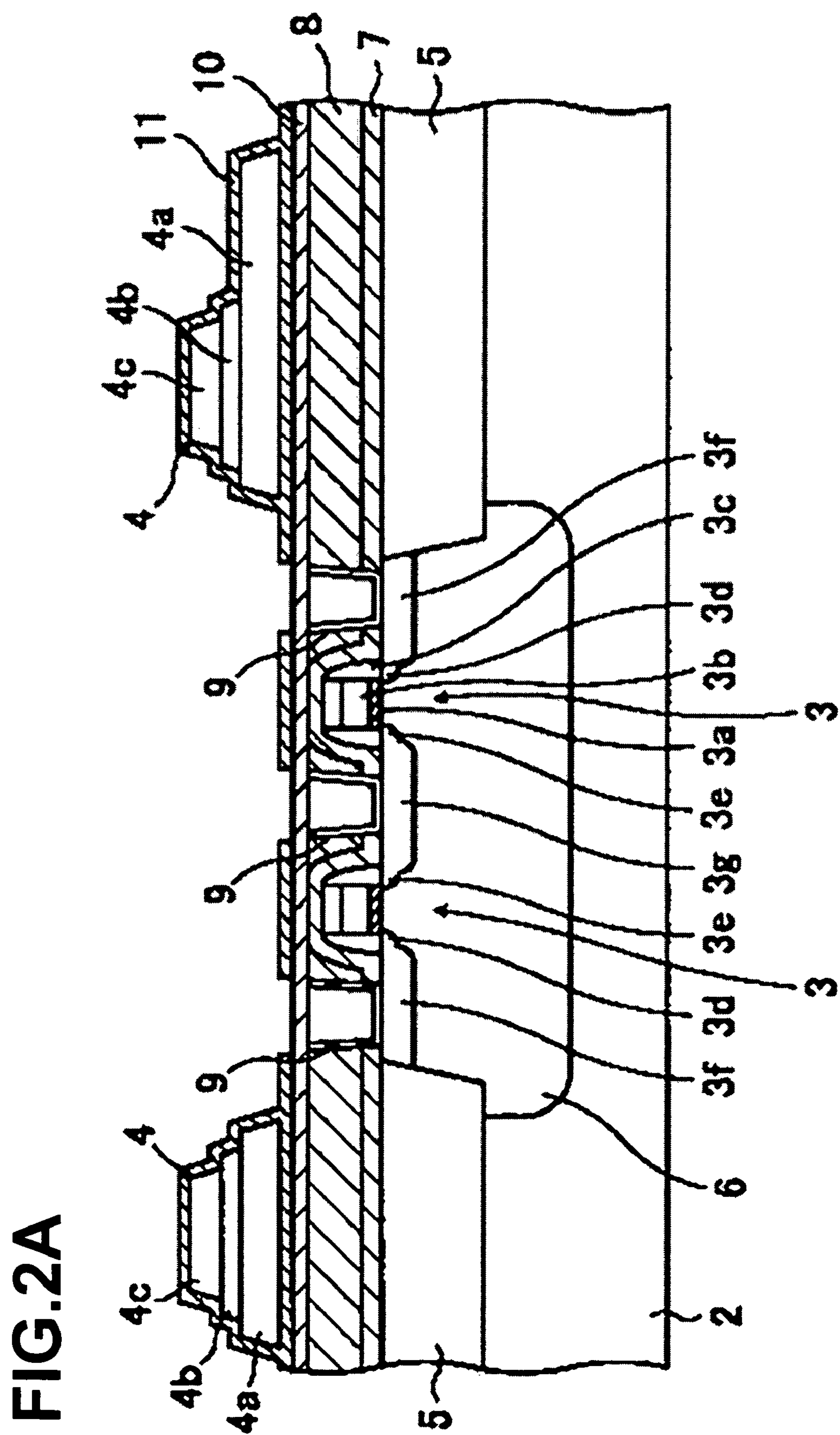
FIGS. 2A to 2E are schematic cross-sectional views of the relevant part after ferroelectric capacitors are formed.
Figure 2B:
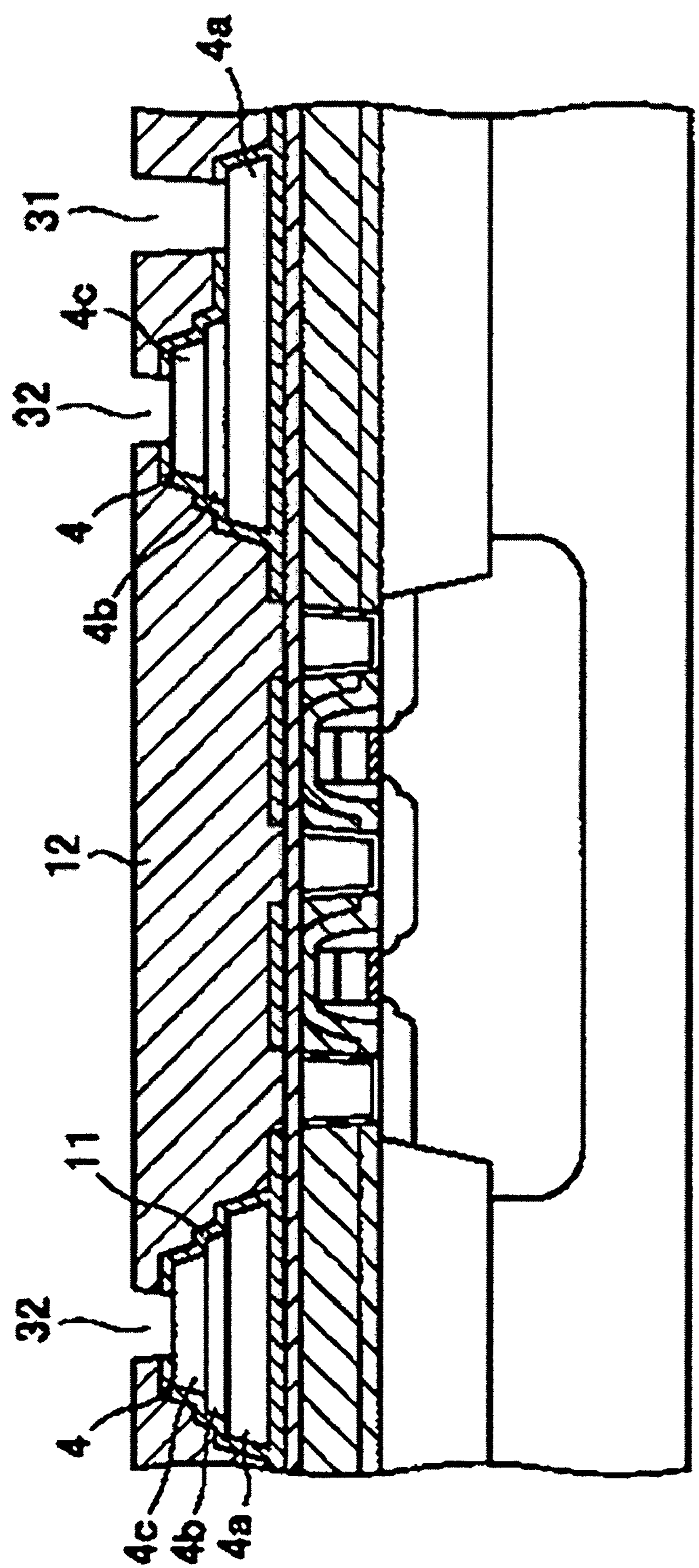
Figure 2C:
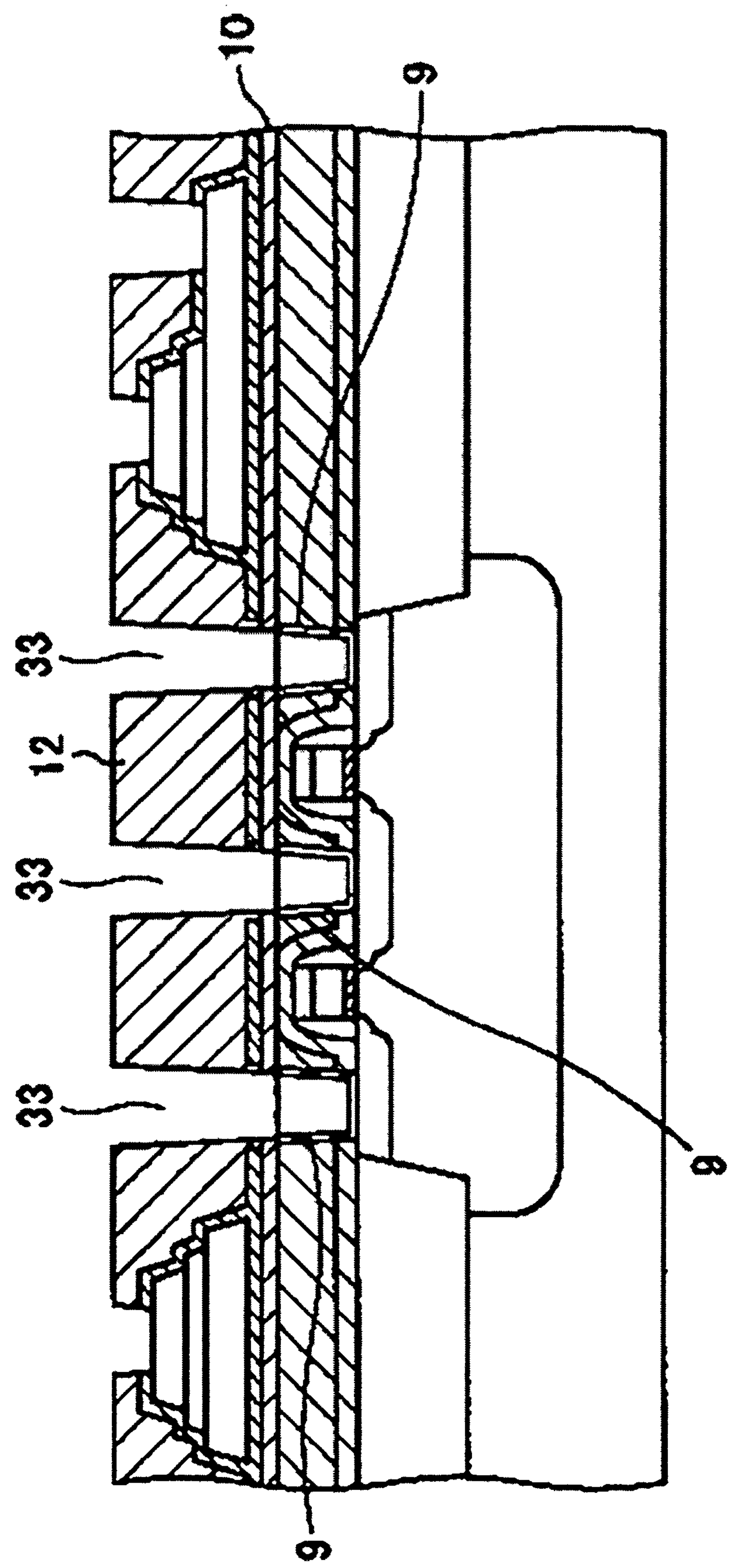
Figure 2D:
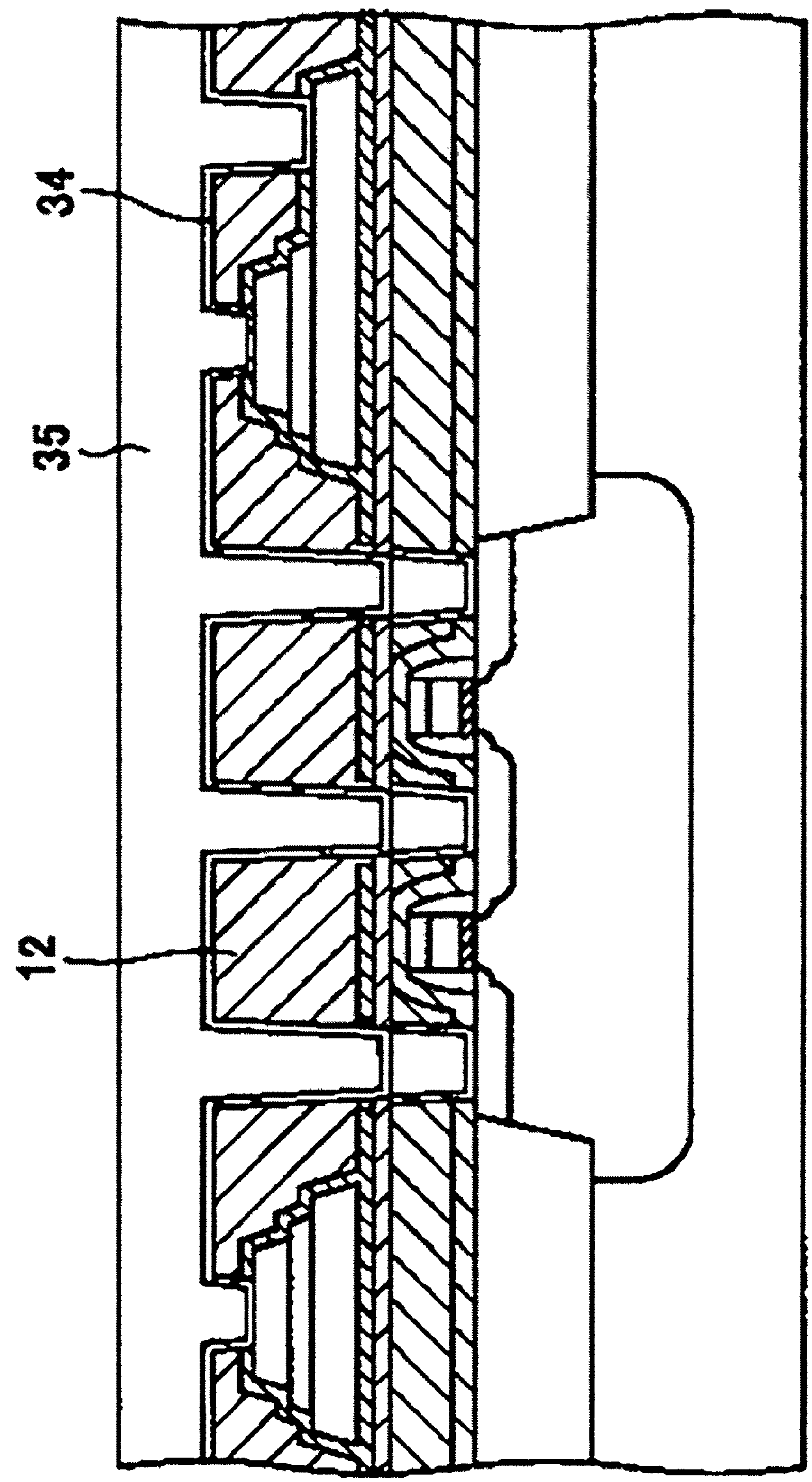
Figure 2E:
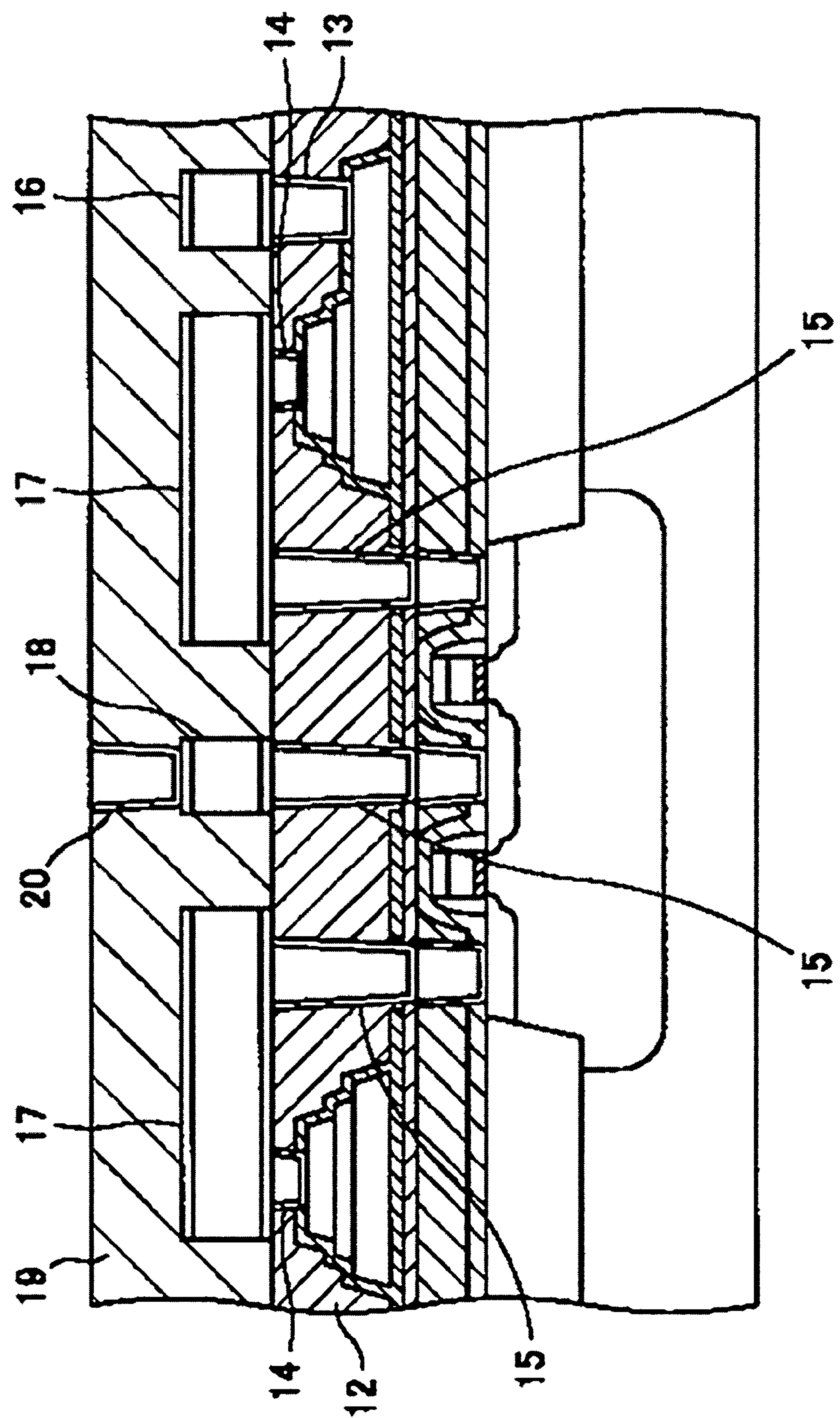

FIG. 1 is a schematic cross-sectional view of the relevant part of an FeRAM. FIG. 1 shows the relevant part of a memory cell of the FeRAM. In FIG. 1, a logic portion of the FeRAM is not shown.

The FeRAM shown in FIG. 1 includes metal oxide semiconductor (MOS) transistors 3 formed using a semiconductor substrate, for example, a silicon (Si) substrate 2 and ferroelectric capacitors 4 that are electrically connected to the MOS transistors 3.

An element isolation region 5 is formed-on the Si substrate 2 by, for example, a shallow trench isolation (STI) method. In the Si substrate 2, a well 6 of a predetermined conductivity type is provided in the area defined by the element isolation region 5.

In the MOS transistors 3, a gate oxide film 3*a* is provided on the Si substrate 2 in which the well 6 is provided, and a gate electrode 3*b* is provided on the gate oxide film 3*a*. The surface layer of the gate electrode 3*b* is silicidized. Sidewalls 3*c* are provided on the side faces of the gate electrode 3*b*. Extension regions 3*d* and 3*e*, a source region 3*f*, and a drain region 3*g* are provided in areas of the Si substrate 2, the areas being located at both sides of the gate electrode 3*b*.

A cover film 7 covering the-MOS transistors 3 is provided on the Si substrate 2. The cover film 7 is composed of a stacked film including, for example, a silicon oxide (SiO) film and a silicon nitride (SiN) film. A first interlayer insulating film 8 is provided on the cover film 7. The first interlayer insulating film 8 is composed of, for example, a SiO film (tetraethoxysilane (TEOS) oxide film) formed by using TEOS. Plugs 9 are provided in contact holes penetrating through the first interlayer insulating film 8 and the cover film 7. The plugs 9 are-connected to the source region 3*f* and the drain region 3*g* of the MOS transistors 3 via a diffusion-preventing film 9*a*. The diffusion-preventing film 9*a* is composed of a stacked film (Ti/TiN film) including a titanium (Ti) film and a titanium nitride (TiN) film. A tungsten (W) film 9*b* is formed in each of the plugs 9.

An anti-oxidation film 10 for preventing the plugs 9 from being oxidized during annealing in-an oxygen atmosphere described below is provided on the first interlayer insulating film 8. The anti-oxidation film 10 is composed of, for example, a stacked film including a silicon oxynitride (SION) film and a TEOS oxide film. Furthermore, an AlO film 11 is provided on the anti-oxidation film 10. A lower electrode 4*a*, a ferroelectric film 4*b*, and an upper electrode 4*c* are sequentially stacked on the AlO film 11 in that order to form a ferroelectric capacitor 4. The lower electrode 4*a* is composed of, for example, a platinum (Pt) film. The ferroelectric film 4*b* is composed of, for example, a PZT film. The upper electrode 4*c* is composed of, for example, an iridium oxide (IrO) film.

The entire surface of the ferroelectric capacitor 4 is covered with the AlO film 11. A second interlayer insulating film 12 composed of, for example, a TEOS oxide film is provided on the AlO film 11. A plug 13 and a plug 14 are connected to the lower electrode 4*a* and the upper electrode 4*c* of the ferroelectric capacitor 4, respectively. In the plug 13, a W film 13*b* is provided in a contact hole penetrating through the second interlayer insulating film 12 and the AlO film 11, with a barrier metal film 13*a* composed of, for example, a TiN film therebetween. In the plug 14, a W film 14*b* is provided in a contact hole penetrating through the second interlayer insulating film 12 and the AlO film 11, with a barrier metal film 14*a* composed of, for example, a TiN film therebetween. Similarly, plugs 15 are provided in which a W film 15*b* is provided in a contact hole penetrating through the second interlayer insulating film 12, the AlO film 11, and the anti-oxidation film 10, with a barrier metal film 15a composed of, for example, a TiN film therebetween. Each of the plugs 15 is connected to a plug 9 provided in the lower layer. The plugs 15 are electrically connected to the source region 3*f* and the drain region 3*g* of the MOS transistors 3.

First wiring layers 16, 17, and 18 are provided on the second interlayer insulating film 12 including the plugs 13, 14, and 15 therein. The first wiring layers 16, 17, and 18 are formed by stacking, for example, Ti/TiN films 16*a*, 17*a*, and 18*a*, aluminum (Al)-copper (Cu) alloy films (AlCu film) 16*b*, 17*b*, and 18*b*, and Ti/TiN films 16*c*, 17*c*, and 18*c*, respectively, in that order.

The wiring 16 is provided on the plug 13 connected to the lower electrode 4*a* of the ferroelectric capacitor 4. The wiring 17 is provided so as to cover the plug 14 connected to the upper electrode 4*c* of the ferroelectric capacitor 4 and the plug 15 that is electrically connected to the source region 3*f* of the MOS transistor 3. The wiring 18 is provided on the plug 15 that is electrically connected to the drain region 3*g* of the MOS transistor 3.

A third interlayer insulating film 19 composed of, for example, a TEOS oxide film is provided on the wirings 16, 17, and 18. A plug 20 is connected to the wiring 18 that is electrically connected to the drain region 3*g*. In the plug 20, a W film 20*b* is provided in a contact hole penetrating through the third interlayer insulating film 19, with a barrier metal film 20*a* composed of, for example, a Ti/TiN film therebetween.

Furthermore, a second wiring layer 21 in which a Ti/TiN film 21*a*, an AlCu film 21*b*, and a Ti/TiN film 21*c* are sequentially stacked is provided on the plug 20. The second wiring layer 21 is formed by, for example, sequentially stacking the Ti/TiN film 21*a*, the AlCu film 21*b*, and the Ti/TiN film 21*c*. A plug 23 is connected to the wiring 21. In the plug 23, a W film 23*b* is provided in a contact hole penetrating through a fourth interlayer insulating film 22 composed of, for example, a TEOS oxide film, with a barrier metal film 23*a* composed of, for example, a Ti/TiN film therebetween.

Similarly, although not shown in the figure, wiring layers including, for example, a third wiring layer, a fourth wiring layer, and a fifth wiring layer are sequentially provided on the fourth interlayer insulating film 22. Furthermore, an appropriate cover film is provided thereon. In addition, pads that are electrically connected to the wiring layers are provided on the cover film, and a polyimide film or the like is provided on the surface of areas other than the pads.

The FeRAM having the above-described basic structure is produced by a method described below.

FIG. 2 is a schematic cross-sectional view of the relevant part after ferroelectric capacitors are formed.

First, an element isolation region 5 is formed on a Si substrate 2 by, for example, an STI method. A well 6 is formed by performing ion implantation of an impurity of a predetermined conductivity type in the element isolation region 5.

Subsequently, a SiO film having a predetermined thickness is formed on the Si substrate 2 by a thermal oxidation method or a chemical vapor deposition (CVD) method. Furthermore, a polysilicon film used as a gate electrode material is formed on the SiO film by, for example, a CVD method so as to have a predetermined thickness. The polysilicon film and the SiO film are processed so as to have a predetermined shape. Thus, gate electrodes 3*b* and gate oxide films 3*a* are formed.

Subsequently, an impurity of a predetermined conductivity type is introduced by ion implantation in areas of the Si substrate 2, the areas being located at both sides of each of the gate electrodes 3*b*. Accordingly, extension regions 3*d* and 3*e* are-formed.

Sidewalls 3*c* are then formed on the side faces of each of the gate electrodes 3*b*. Subsequently, an impurity of a predetermined conductivity type is introduced in areas of the Si substrate 2, the areas being located at both sides of the sidewalls 3*c*, by ion implantation, thus forming a source region 3*f* and a drain region 3*g*. Accordingly, MOS transistors 3 are formed.

After the formation of the MOS transistors 3, first, a cover film 7 is formed on the entire surface of the substrate. The cover film 7 is formed by sequentially depositing a Sib film having a thickness of about 20 nm and a SiN film having a thickness of about 80 nm. The cover film 7 is formed by a plasma CVD method or the like.

Subsequently, for example, a TEOS oxide film having a thickness of about 1,000 nm-is deposited by a plasma CVD method. The TEOS oxide film is polished by chemical mechanical polishing (CMP) until the thickness of the remaining film is decreased to about 700 nm. Accordingly, a first interlayer insulating film 8 is formed.

The first interlayer insulating film 8 is then etched to form contact holes reaching the source region 3*f* and the drain region 3*g*. After the formation of the contact holes, a Ti film having a thickness of about 30 nm and a TiN film having a thickness of about 20 nm are sequentially deposited on the entire surface by, for example, a sputtering method. Furthermore, a W film is deposited on the TiN film by a CVD method to fill the contact holes. Unnecessary portions on the first interlayer insulating film 8 are then removed by CMP, thus forming plugs 9 in the contact holes.

Subsequently, for example, a SION film having a thickness of about 100 nm and a TEOS oxide film having a thickness of about 130 nm are sequentially deposited on the entire surface to form an anti-oxidation film 10.

Ferroelectric capacitors 4 are produced by a process described below. When the ferroelectric capacitors 4 are formed, first, it is necessary to form a lower electrode 4*a* and a ferroelectric film 4*b* that have satisfactory crystallinity. For this purpose, an AlO film 11 is deposited on the anti-oxidation film 10. For example, a Pt film and a PZT film are sequentially deposited on this AlO film 11, and crystallization annealing is then performed. The Pt film is formed so as to have a thickness in the range of about 130 to 180 nm. The PZT film is formed so as to have a thickness in the range of about 130 to 180 nm. An IrO film is deposited on the PZT film, followed by crystallization annealing. An IrO film is then further deposited thereon. As a result, an IrO film having a total thickness in the range of about 200 to 300 nm is formed.

Subsequently, the IrO film, the PZT film, and the Pt film are sequentially etched in three stages using separate resist patterns. An upper electrode 4*c*, the ferroelectric film 4*b*, and the lower electrode 4*a* are formed by this etching. Accordingly, the ferroelectric capacitors 4 are formed.

An AlO film 11 is further deposited on the ferroelectric capacitors 4. Consequently, each of the ferroelectric capacitors 4 is completely covered with this AlO film 11 together with the other AlO film 11 that has been previously formed. Accordingly, as described above, intrusion of moisture and hydrogen into the ferroelectric capacitors 4 can be suppressed.

Subsequently, the AlO film 11 disposed on the plugs 9 is removed by etching. The reason for this is as follows. In a subsequent step, contact holes reaching the plugs 9 are formed by etching. In that case, if the AlO film 11 still remains on the plugs 9, the AlO film 11 serves as an etching stopper and prevents the formation of the contact holes. In order to prevent this phenomenon, the AlO film 11 disposed on the plugs 9 is removed.

The structure shown in FIG. 2 is obtained by the above described steps.

Figure 3:
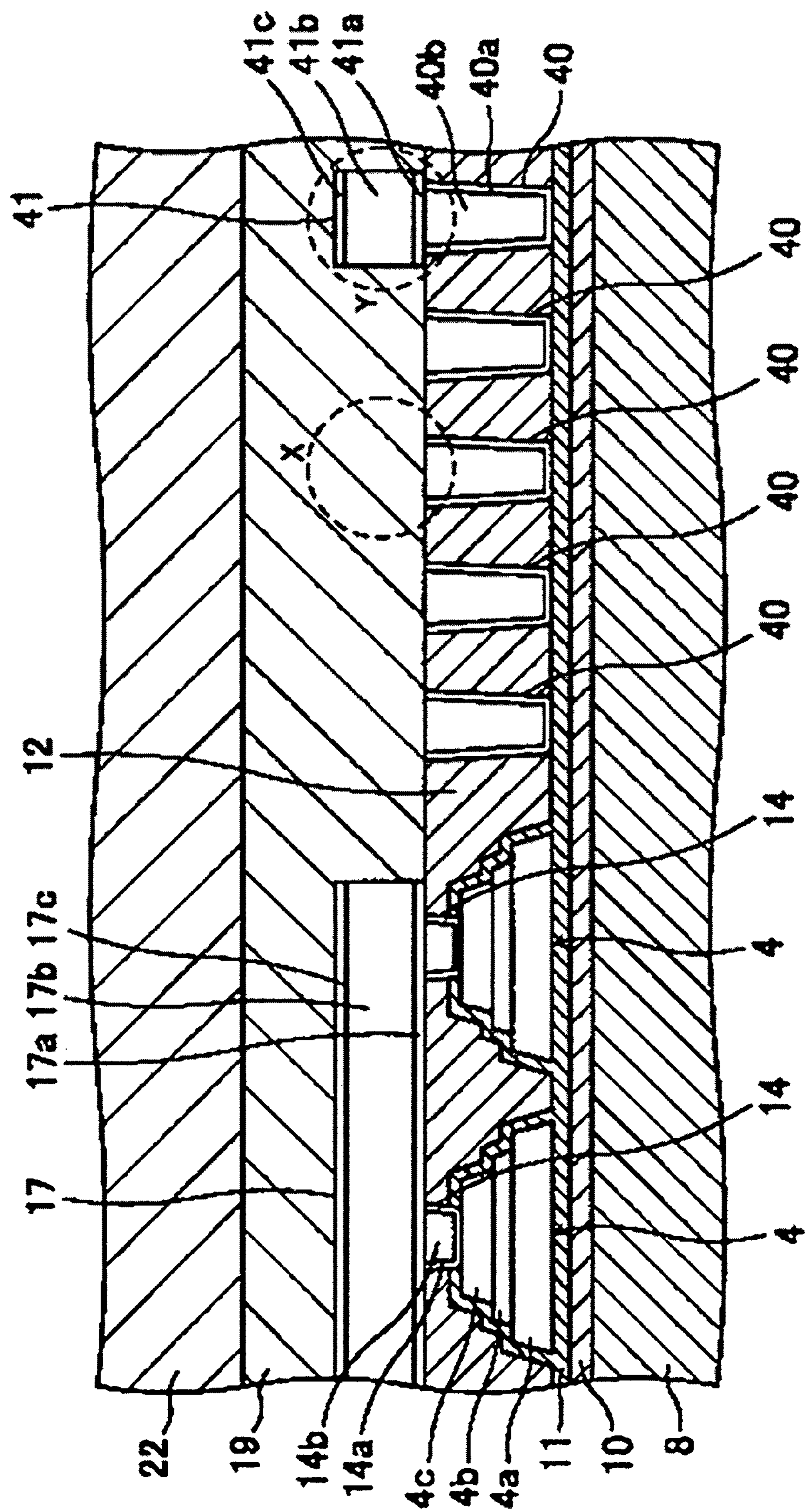
FIG. 3 is a schematic cross-sectional view of the relevant part showing an example of the structure near ferroelectric capacitors in an FeRAM according to a first embodiment.

FIG. 3 is a schematic cross-sectional view of the relevant part showing a step of forming first contact holes.

Subsequently, for example, a TEOS oxide film having a thickness of about 1,500 nm is deposited by a plasma CVD method. The TEOS oxide film is then polished by CMP until the thickness of the remaining film is decreased to about 1,000 nm. Accordingly, a second interlayer insulating film 12 is formed. After resist patterning, a part of the second interlayer insulating film 12 and a part of the AlO film 11 are removed by etching. As a result, contact holes 31 and 32 reaching the lower electrode 4*a* and the upper electrode 4*c*, respectively, of the ferroelectric capacitors 4 are formed.

After the contact holes 31 and 32 are formed, annealing (recovery annealing) is performed, for example, in an oxygen atmosphere at about 450° C. to 550° C. for about 60 minutes. Characteristics of the ferroelectric capacitors 4 that are degraded by the previous etching process and the like can be recovered by this annealing (recovery annealing).

Figure 4:
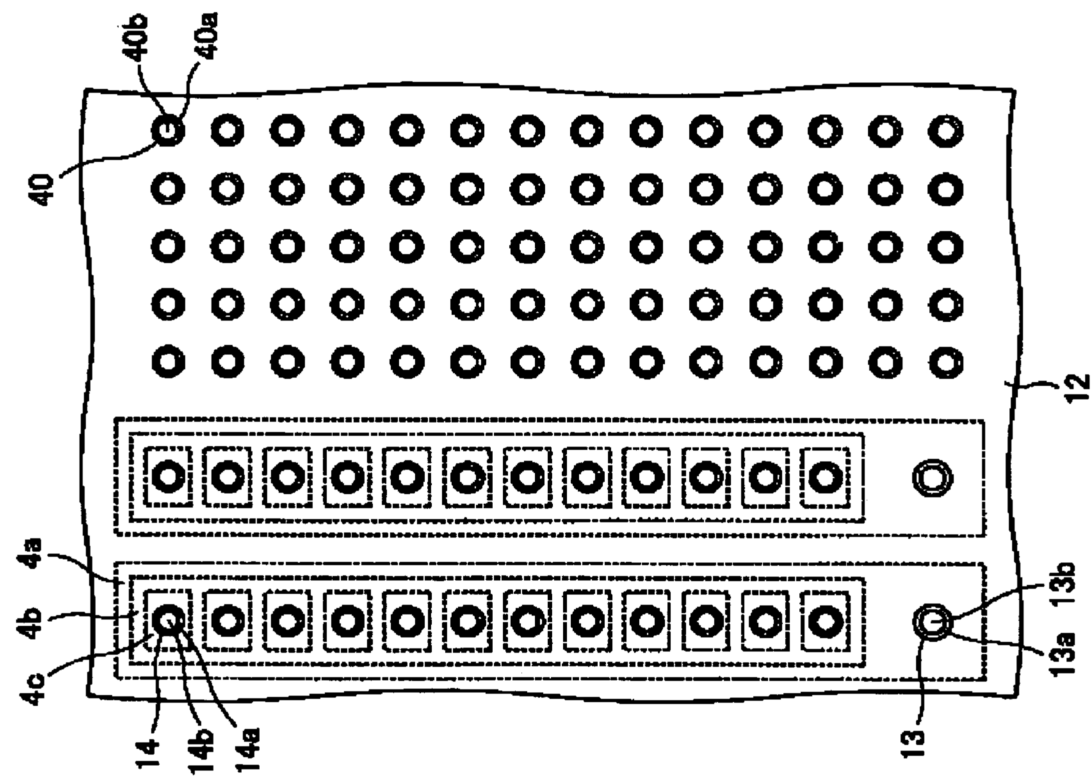
FIG. 4 is a schematic plan view of the relevant part of a layer including the ferroelectric capacitors in the FeRAM according to the first embodiment.
Figure 5A:
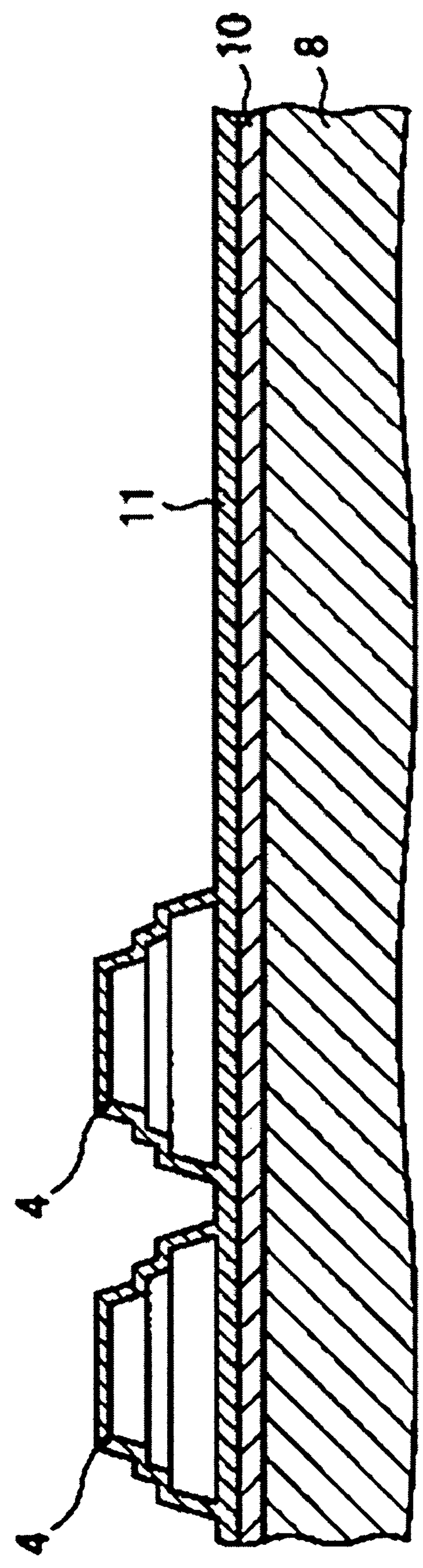
FIGS. 5A to 5D are schematic cross-sectional views of the relevant part after ferroelectric capacitors of the first embodiment are formed.
Figure 5B:
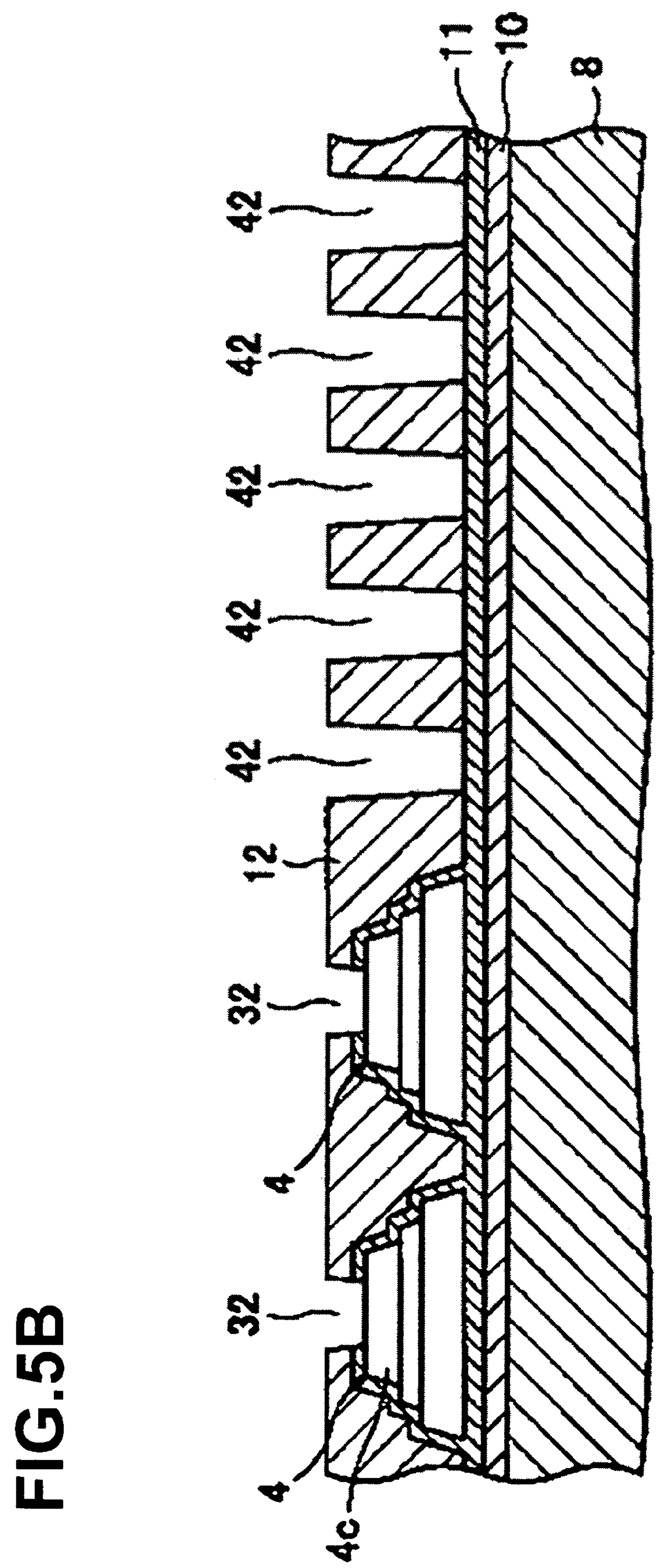
Figure 5C:
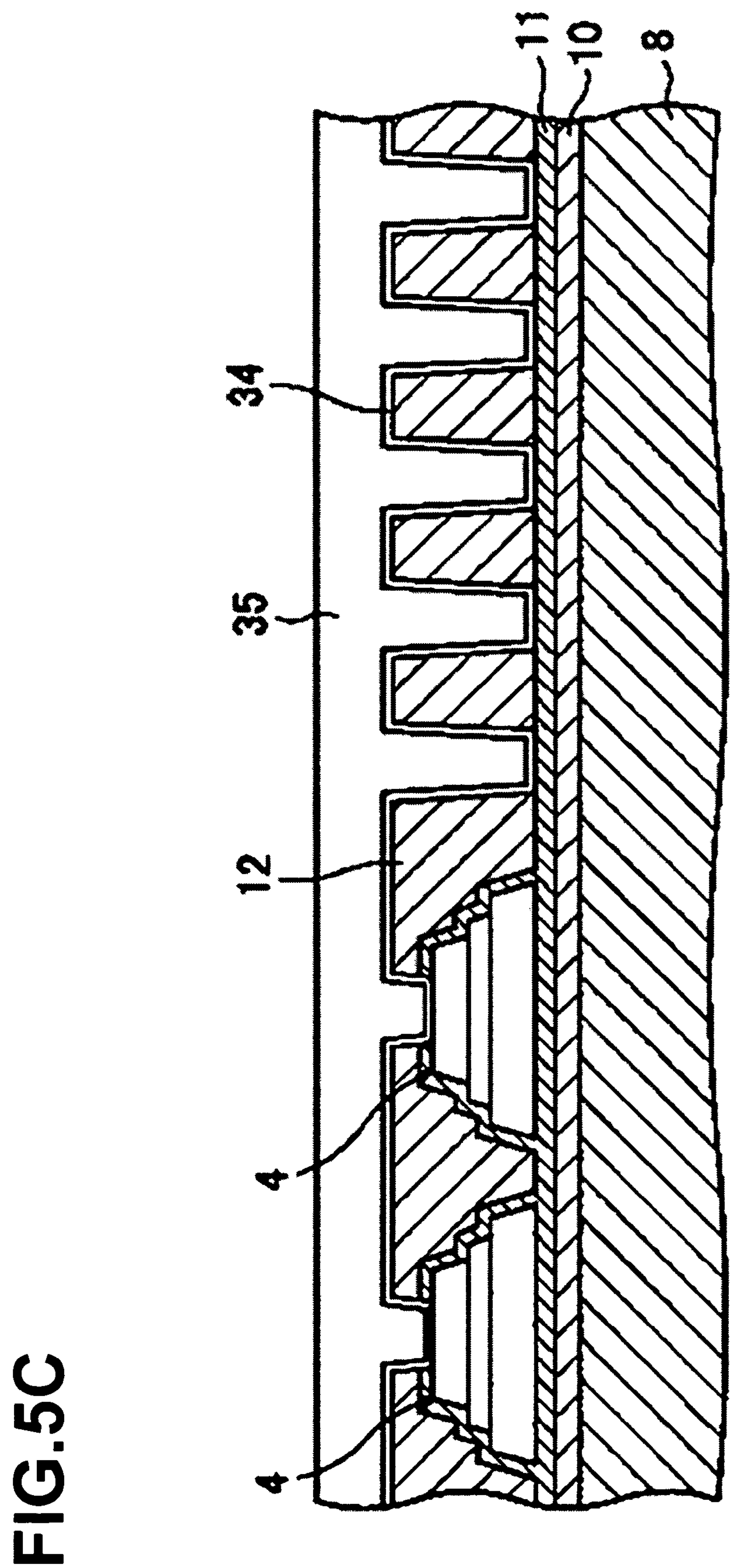
Figure 5D:
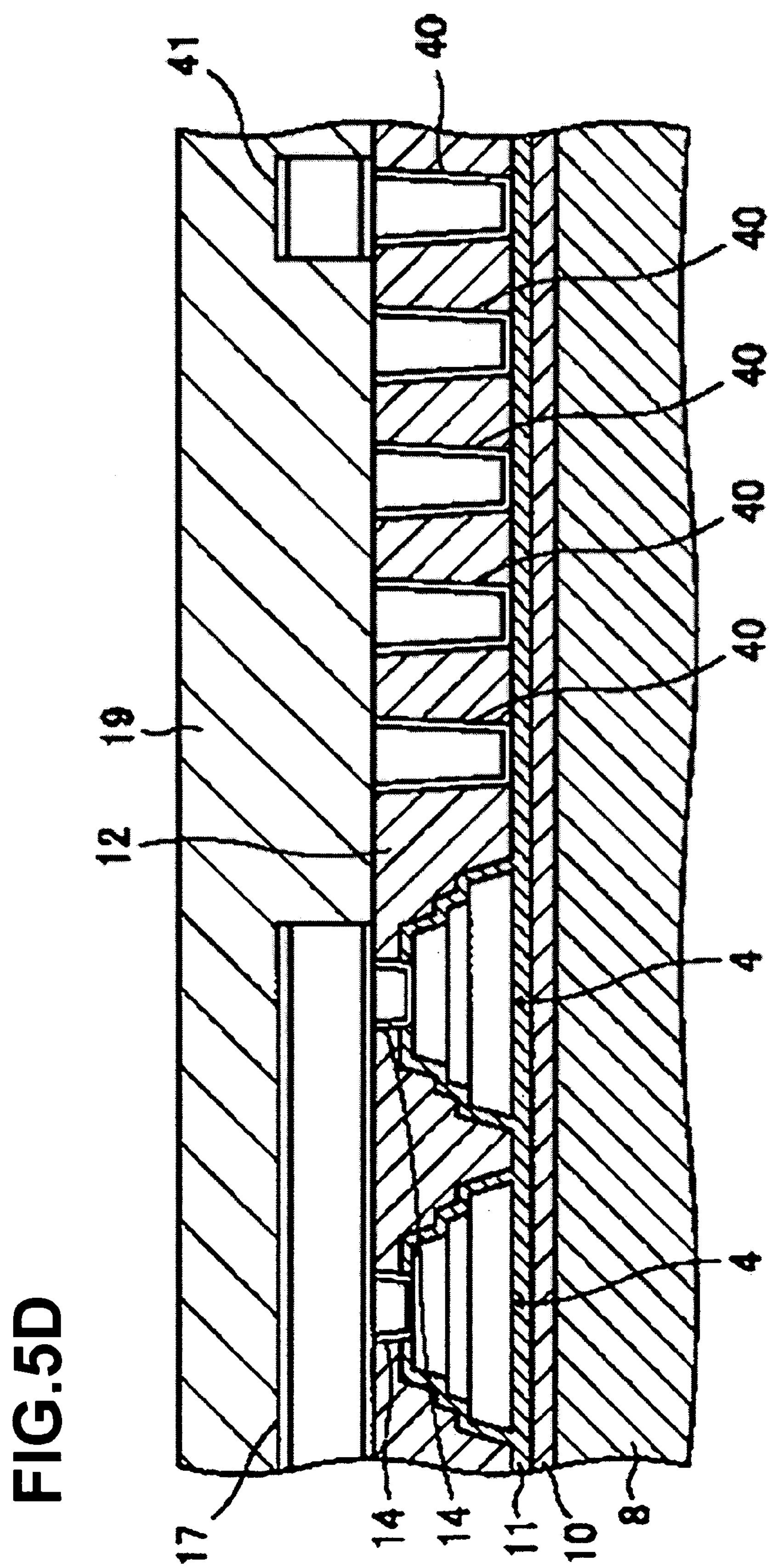

FIG. 4 is a schematic cross-sectional view of the relevant part showing a step of forming second contact holes.

After the annealing, a part of the second interlayer insulating film 12 and a part of the anti-oxidation film 10 are removed by etching. As a result, contact holes 33 reaching the plugs 9 provided on the lower layer are formed.

FIG. 5 is a schematic cross-sectional view of the relevant part showing a step of filling the contact holes.

As shown in FIGS. 3 and 4, contact holes 31, 32, and 33 are formed. Subsequently, as shown in FIG. 5, a TiN film 34 having a thickness of about 100 nm is deposited on the entire surface by a sputtering method or the like. Furthermore, a W film 35 is deposited by a CVD method. As a result, the contact holes 31, 32, and 33, which are formed in the steps shown in FIGS. 3 and 4, are filled at the same time.

Unnecessary portions on the second interlayer insulating film 12 are then removed by CMP. As a result, plugs 13, 14, and 15 are formed in the contact holes 31, 32, and 33, respectively.

Figure 6:
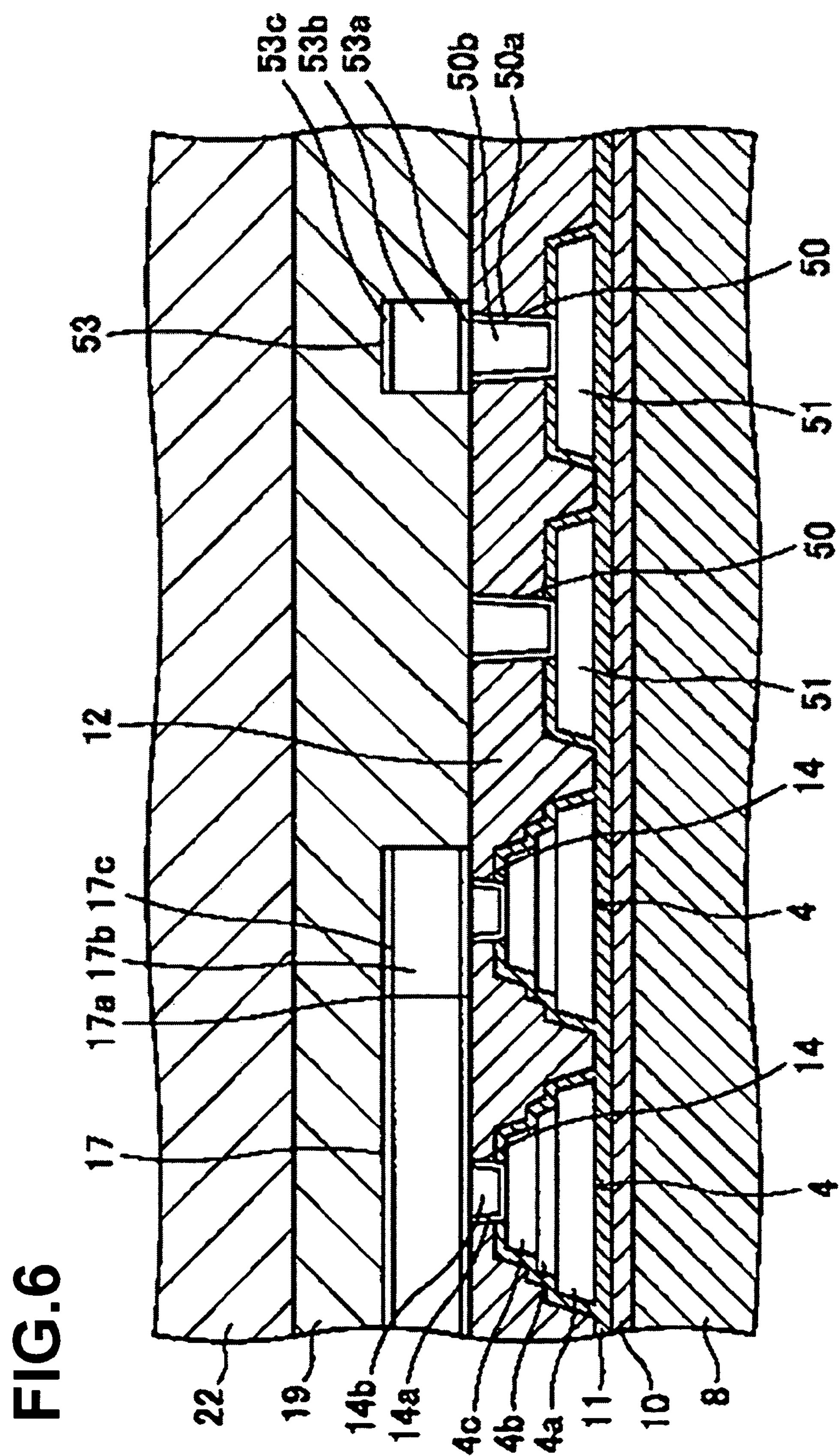
FIG. 6 is a schematic cross-sectional view of the relevant part showing an example of the structure near ferroelectric capacitors in an FeRAM according to a second embodiment.

FIG. 6 is a schematic cross-sectional view of the relevant part showing a step of forming a wiring layer.

Subsequently, as shown in FIG. 6, wirings 16, 17, and 18 are formed on the plugs 13, 14, and 15, respectively. In this step, first, for example, a Ti/TiN film is formed by stacking a Ti film and a TiN film on the second interlayer insulating film 12 in which the plugs 13, 14, and 15 are formed. The Ti film is formed so as to have a thickness in the range of about 40 to 80 nm. The TiN film is formed so as to have a thickness in the range of about 20 to 40 nm. Subsequently, for example, an AlCu film is formed on the Ti/TiN film. The AlCu film is formed so as to have a thickness in the range of about 300 to 400 nm. Subsequently, for example, a Ti/TiN film is formed by stacking a Ti film and a TiN film on the AlCu film. The Ti film is formed so as to have a thickness in the range of about 3 to 8 nm. The TiN film is formed so as to have a thickness in the range of about 50 to 90 nm. An antireflection film composed of a SION film or the like is formed on the Ti/TiN film. Subsequently, a resist pattern is formed on the antireflection film. The antireflection film is etched so as to have a predetermined wiring pattern, thereby forming the wirings 16, 17, and 18. The antireflection film is not shown in the figure.

Subsequently, as shown in FIG. 6, for example, a TEOS oxide film having a thickness of about 1,500 nm is deposited by a plasma CVD method to form a third interlayer insulating film 19. A contact hole is formed and then filled, thus forming a plug 20. Accordingly, the first wiring layer is formed.

Similarly, a second wiring layer and subsequent wiring layers are sequentially formed. For example, after a fifth wiring layers is formed, a cover film (not shown) composed of a first cover film and a second cover film is deposited by a CVD method or the like. The first cover film is composed of a high-density plasma (HDP) undoped silicate glass. (USG) film having a thickness in the range of about 700 to 800 nm. The second cover film is composed of a SiN film having a thickness in the range of about 400 to 600 nm. Contact holes used for leading pads are then formed. A polyimide film is formed and then patterned, thus the basic structure of the FeRAM can be produced.

A logic portion (not shown) of the FeRAM is formed together with the above memory portion. The wirings 16, 17, 18, and the like have the same structure as those of wirings used in the logic portion. Therefore, problems do not occur in terms of the processing and the reliability of the wiring.

Embodiments in which a structure for suppressing the degradation of the ferroelectric capacitors 4 caused by moisture and hydrogen is applied to the FeRAM having the above basic structure will be described below.

First, a first embodiment)will now be described.

Figure 7:
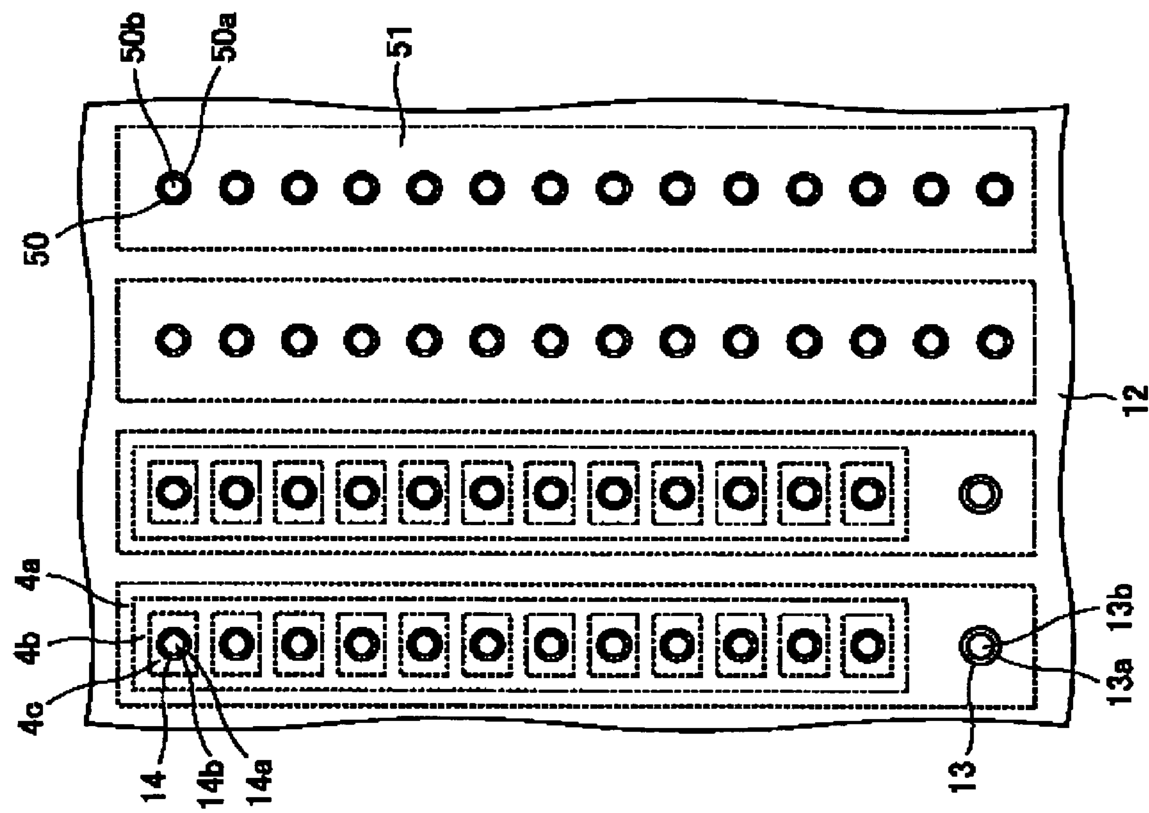
FIG. 7 is a schematic plan view of the relevant part of a layer including the ferroelectric capacitors in the FeRAM according to the second embodiment.
Figure 8A:
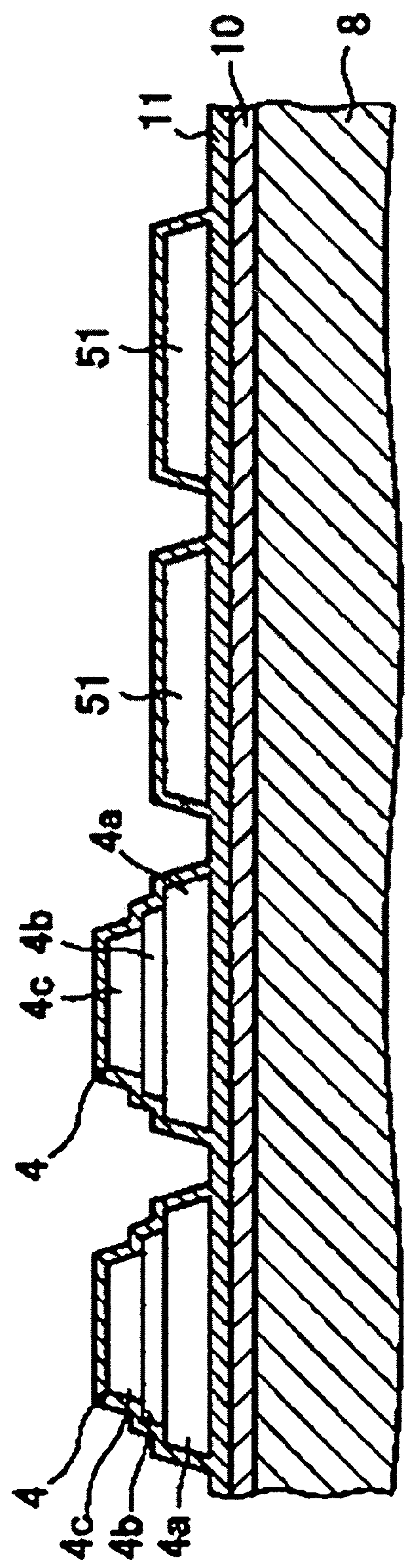
FIGS. 8A to 8B are schematic cross-sectional views of the relevant part after the ferroelectric capacitors of the second embodiment are formed.
Figure 8B:
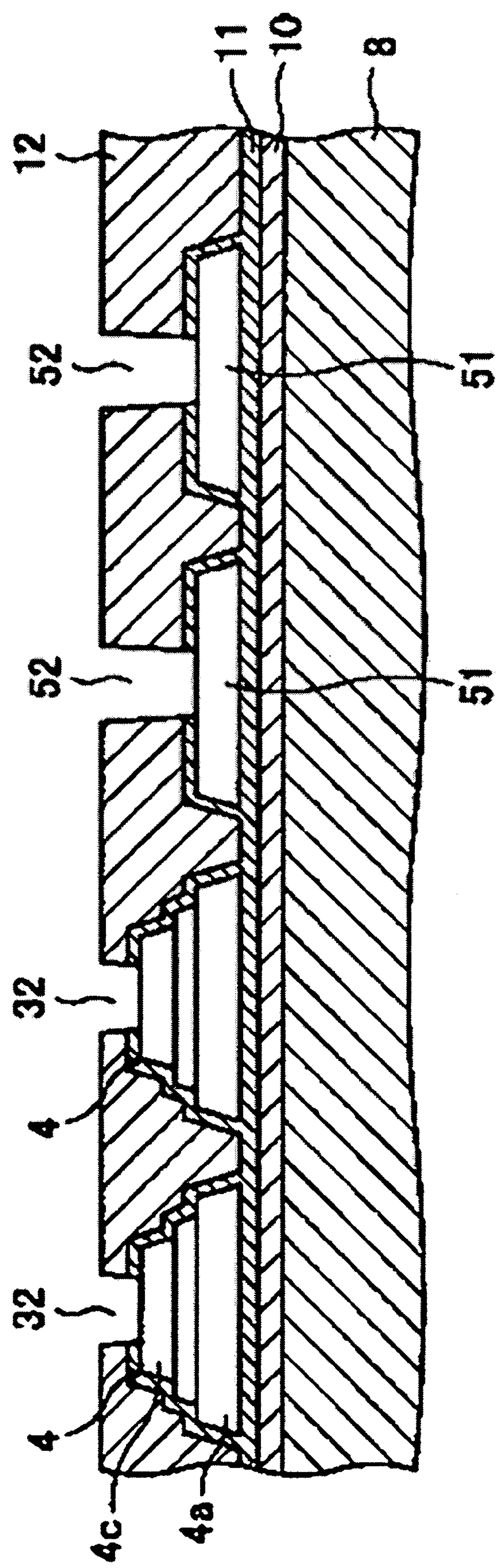

FIG. 7 is a schematic cross-sectional view of the relevant part showing an example of the structure near ferroelectric capacitors in an FeRAM according to the first embodiment. FIG. 8 is a schematic plan view of the relevant part of a layer including the ferroelectric capacitors in the FeRAM according to the first embodiment.

For convenience of description, FIGS. 7 and 8 show a structure in which the wiring 17 that is electrically connected to the upper electrode 4*c* of the ferroelectric capacitors 4 extends in a direction orthogonal to the direction in which-the lower electrode 4*a* of the ferroelectric capacitors 4 extends.

In the FeRAM of the first embodiment, a plurality of dummy plugs 40 are disposed in the second interlayer insulating film 12 at an end of the memory cell array. The dummy plugs 40 have the same structure as that of other plugs 14 and the like provided in the same layer. More specifically, in each of the dummy plugs 40, a W film 40*b* is provided in a contact hole penetrating through the second interlayer insulating film 12, with a diffusion-preventing film 40*a* composed of, for example, a TiN film therebetween.

By providing the dummy plugs 40 near the ferroelectric capacitors 4, the volume of the second interlayer insulating film 12 near the ferroelectric capacitors 4 can be decreased.

Accordingly, even when the second interlayer insulating film 12 contains moisture, the effect of the moisture on the ferroelectric capacitors 4 can be decreased. Consequently, the degradation of the ferroelectric capacitors 4 can be suppressed.

In this embodiment, a plurality of dummy plugs 40 is provided in the layer in which the ferroelectric capacitors 4 are provided. However, the effect of the moisture contained in the second interlayer insulating film 12 on the ferroelectric capacitors 4 can be suppressed as long as at least one dummy plug 40 is provided in the layer. This is because when at least one dummy plug 40 is provided, the volume of the second interlayer insulating film 12 in the layer including the ferroelectric capacitors 4 is smaller than that in the case where the dummy plug 40 is not provided.

In order to effectively suppress the effect of moisture contained in the second interlayer insulating film 12 on the ferroelectric capacitors 4, at least one dummy plug 40 is preferably disposed in the vicinity of the ferroelectric capacitors 4.

The size (diameter) of the dummy plugs 40 is not particularly limited. However, the following point should be considered: For example, as described below, the dummy plugs 40 are formed by filling contact holes and then planarizing the resulting film by CMP. Accordingly, when the diameter of the dummy plugs 40 is large, in some diameters, dishing or the like may occur in the dummy plugs 40.

Dummy plugs 40 having a relatively large diameter may be formed on areas near the ferroelectric capacitors 4. Dummy plugs 40 having a relatively small diameter may be formed on areas away from the ferroelectric capacitors 4. The diameter of the dummy plugs 40 may be separately set in different areas in the same layer.

FIG. 7 show the case where the dummy plugs 40 are formed in contact holes penetrating through the second interlayer insulating film 12. Alternatively, the dummy plugs 40 may be formed in contact holes penetrating through the second interlayer insulating film 12 and the AlO film 11 provided thereunder in accordance with the conditions for forming the contact holes, the thickness of the second interlayer insulating film 12, or the like. More specifically, the contact holes may be formed by etching using the anti-oxidation film 10 provided under the AlO film 11 as an etching stopper, and the dummy plugs 40 may be formed in the resulting contact holes.

As shown in portion X of FIG. 7, an upper third interlayer insulating film 19 may be formed directly on the dummy plugs 40. Alternatively, as shown in portion Y of FIG. 7, the same structure as that of the wiring 17 or the like, for example, a wiring 41 having a structure in which a Ti/TiN film 41*a*, an AlCu film 41*b*, and a Ti/TiN film 41*c* are stacked, may be formed on the dummy plugs 40. This wiring 41 may be a wiring included in a circuit in the FeRAM. Alternatively, the wiring 41 may be a dummy (dummy wiring) that does not function as a circuit. Both the structure shown by portion X and the structure shown by portion Y in FIG. 7 may be provided in the FeRAM.

The FeRAM of the first embodiment having the above structure is formed by a method described below.

First, FIG. 2 shows a structure in which ferroelectric capacitors 4 and an AlO film 11 are formed.

Figure 9:
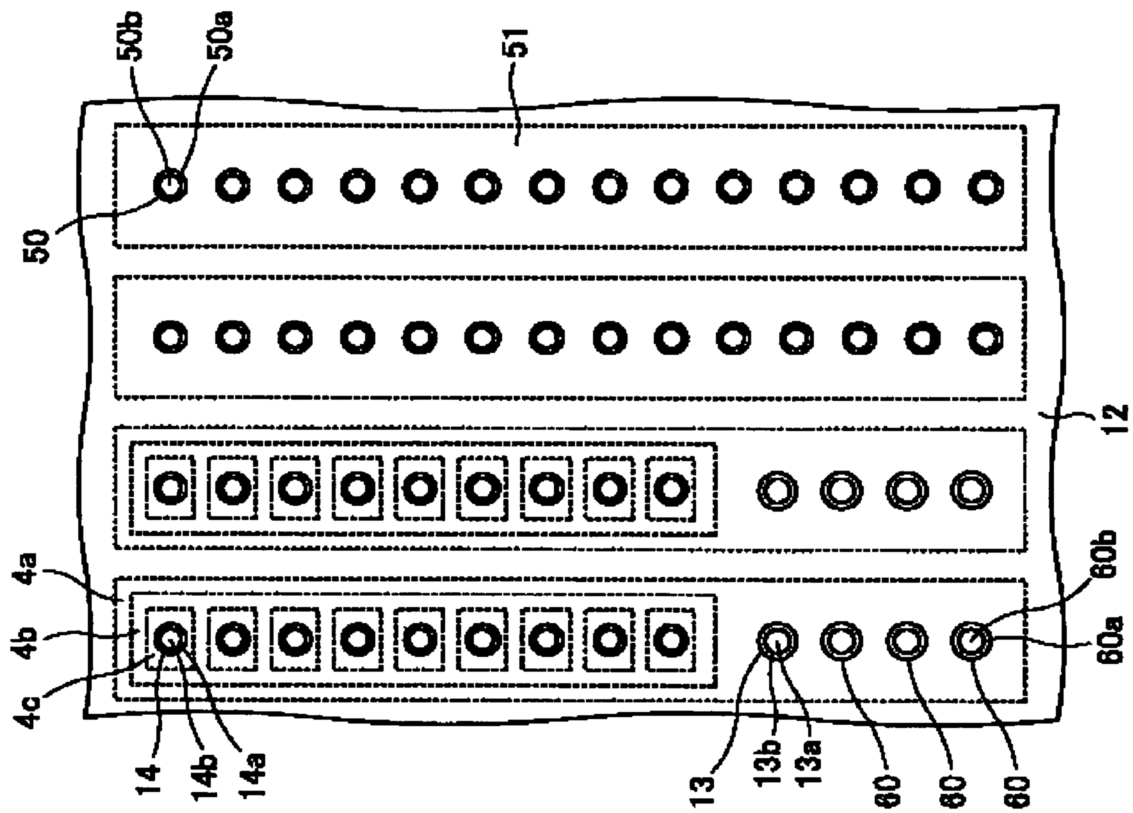
FIG. 9 is a schematic plan view of the relevant part illustrating a modification of the second embodiment.

FIG. 9 is a schematic cross-sectional view of the relevant part after the ferroelectric capacitors of the first embodiment are formed.

By the step of forming the ferroelectric capacitors 4 and the AlO film 11 shown in FIG. 2, the structure shown in FIG. 9 is obtained at an end of the memory cell array.

After the steps shown in FIGS. 2 and 9, as shown in FIG. 3, a second interlayer insulating film 12 is formed. Contact holes 31 and 32 reaching a lower electrode 4*a* and an upper electrode 4*c* of the ferroelectric capacitors 4, respectively, are then formed.

Figure 10:
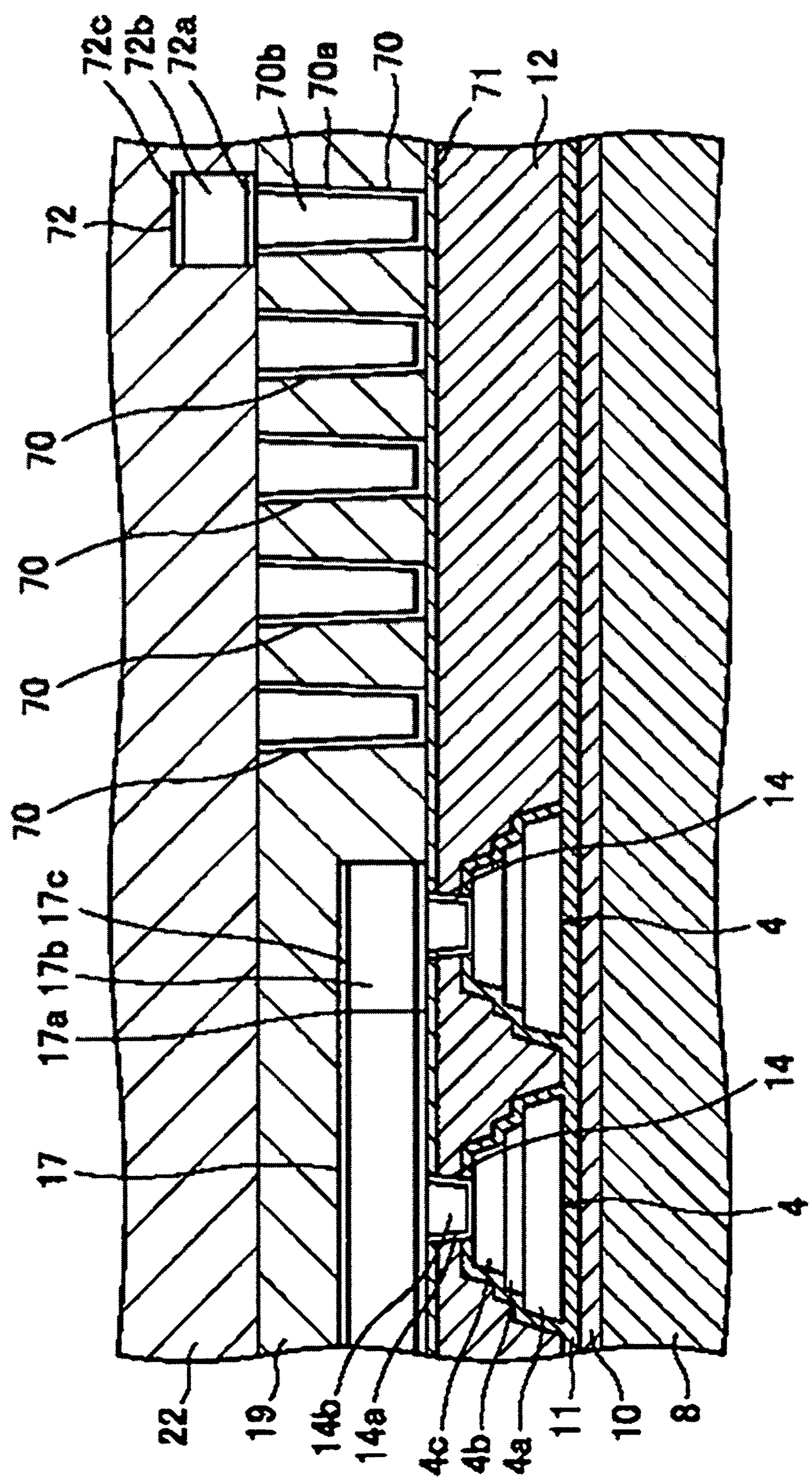
FIG. 10 is a schematic cross-sectional view of the relevant part showing an example of the structure near ferroelectric capacitors in an FeRAM according to a third embodiment.

FIG. 10 is a schematic cross-sectional view of the relevant part showing a step of forming contact holes according to the first embodiment.

In the step of forming such contact holes 31 and 32 shown in FIG. 3, as shown in FIG. 10, dummy contact holes 42 are formed near the ferroelectric capacitors 4 together with the contact holes 31 and 32.

The dummy contact holes 42 are formed together with the contact holes 31 and 32 by etching using an AlO film 11 or an anti-oxidation film 10 near the ferroelectric capacitors 4 as an etching stopper. For example, in FIG. 10, the AlO film 11 functions as the etching stopper. A mask having a pattern that can finally provide a resist pattern on which openings are provided at positions where the contact holes 31 and 32 and the dummy contact holes 42 are formed is used as a mask for forming a resist pattern of the etching.

After the contact holes 31 and 32 and the dummy contact holes 42 are formed as described above, predetermined recovery annealing is performed. The characteristics of the ferroelectric capacitors 4 are recovered by this recovery annealing. At the same time, moisture contained in the second interlayer insulating film 12 is released outside the second interlayer insulating film 12 through the contact holes 31 and 32 and the dummy contact-holes 42.

After the recovery annealing, as shown in FIG. 4, a part of the second interlayer insulating film 12 and a part of the anti-oxidation film 10 are removed by etching. Subsequently, contact holes 33 reaching plugs 9 provided in the lower later are formed.

After the steps shown in FIGS. 3, 10, and 4, as shown in FIG. 5, a TiN film 34 and a W film 35 are deposited on the entire surface, thus filling the contact holes 31, 32, and 33.

Figure 11:
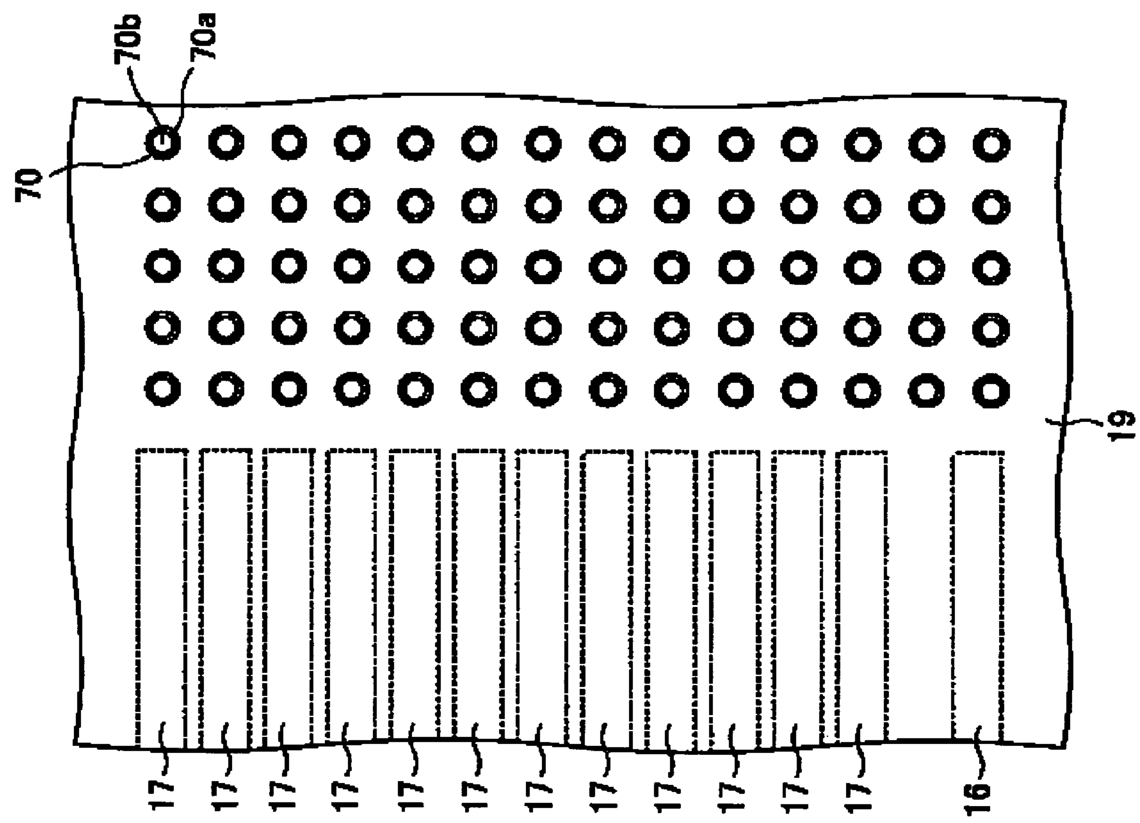
FIG. 11 is a schematic plan view of the relevant part of a layer disposed on the layer including the ferroelectric capacitors in the FeRAM according to the third embodiment.

FIG. 11 is a schematic cross-sectional view of the relevant part showing a step of filling the contact holes according to the first embodiment.

In the step shown in FIG. 5, the contact holes 31, 32, and 33 are filled with the TiN film 34 and the W film 35. In addition, as shown in FIG. 11, the dummy contact holes 42 are filled with the TiN film 34 and the W film 35 together with the contact holes 31, 32, and 33.

Subsequently, by performing CMP, plugs 13, 14, and 15 and dummy plugs 40 are formed in the contact holes 31, 32, and 33 and the dummy contact holes 42, respectively. After the CMP, as shown in FIG. 6, wirings 16, 17, and 18 are formed on the plugs 13, 14, and 15, respectively.

Figure 12:
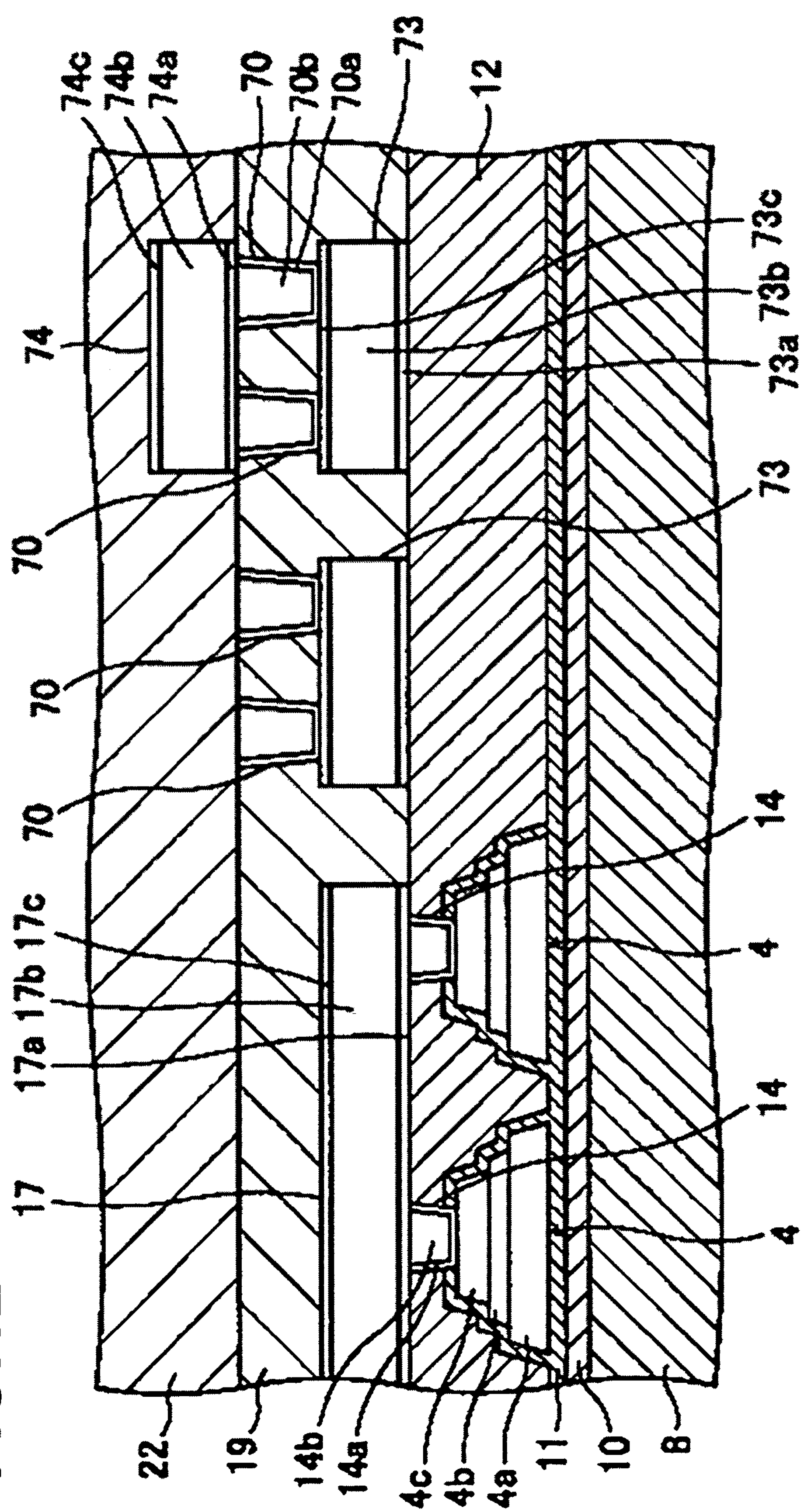
FIG. 12 is a schematic cross-sectional view of the relevant part showing an example of the structure near ferroelectric capacitors in an FeRAM according to a fourth embodiment.

FIG. 12 is a schematic cross-sectional view of the relevant part showing a step of forming a wiring layer according to the first embodiment.

In the step shown in FIG. 6, as shown in FIG. 12, a wiring 41 is formed on a dummy plug 40, as needed. This wiring 41 can be formed together with the wirings 16, 17, and 18 formed on the plugs 13, 14, and 15, respectively. The wiring 41 is formed by, for example, forming a Ti/TiN film, an AlCu film, a Ti/TiN film, and an antireflection film, and then etching the films so as to have a predetermined wiring pattern.

Subsequently, as described in the formation of the basic structure, a third interlayer insulating film 19 is formed. After the formation of a contact hole, a plug 20 shown in FIG. 6 is formed, thus forming the first wiring layer. Similarly, the structures of the upper layers are sequentially formed.

According to the above-described method, the dummy plugs 40 are formed near the ferroelectric capacitors 4.

Accordingly, the volume of the second interlayer insulating film 12 near the ferroelectric capacitors 4 can be decreased. Accordingly, the moisture contained in the second interlayer insulating film 12 near the ferroelectric capacitor 4 is decreased. Accordingly, since the osmotic pressure of the moisture contained in the second interlayer insulating film 12 near the ferroelectric capacitor 4 is decreased, the moisture in the second interlayer insulating film 12 diffusing into the ferroelectric capacitor 4 is decreased. Consequently, the degradation of the ferroelectric capacitors 4 can be suppressed. Furthermore, the entire surface of each ferroelectric capacitor 4 is covered with the AlO film 11. Accordingly, not only the effect of such moisture but also the effect of hydrogen that is present in the inside or that enters from the outside on the ferroelectric capacitor 4 can be reduced. Consequently, this method can realize an FeRAM in which the degradation of the ferroelectric capacitors 4 caused by hydrogen and moisture can be effectively suppressed.

The dummy plugs 40 can be formed together with the plugs 13 and 14 that are electrically connected to the ferroelectric capacitors 4. In order to form the dummy plugs 40 and the plugs 13 and 14 at the same time, it is sufficient that only a pattern of a mask used for forming holes is changed, as compared with a known method. More specifically, it is sufficient that a known mask for forming only the contact holes 31 and 32 is changed to a mask for forming the contact holes 31 and 32, and the dummy contact holes 42 at the same time. By using such a mask, an FeRAM in which the degradation of the ferroelectric capacitors 4 is suppressed can be formed without increasing the number of steps.

Contact holes 31 and 32, and dummy contact holes 42 are formed in the second interlayer insulating film 12. Subsequently, recovery annealing of the ferroelectric capacitors 4 is performed. The plug 13, the plug 14, and the dummy plugs 40 are then formed in the contact hole 31, the contact hole 32, and the dummy contact holes 42, respectively. Therefore, the characteristics of the ferroelectric capacitors 4 can be recovered by the recovery annealing. In addition, moisture can be efficiently removed by the recovery annealing from the second interlayer insulating film 12 through the contact hole 31, the contact hole 32, and the dummy contact holes 42.

In this embodiment, as shown in FIGS. 3 and 10, the dummy contact holes 42 are formed together with the contact holes 31 and 32 reaching the ferroelectric capacitors 4. Subsequently, as shown in FIG. 4, the contact holes 33 reaching the plugs 9 provided in the lower layer are formed. Alternatively, after the contact holes 31 and 32 reaching the ferroelectric capacitors 4 are formed, the dummy contact holes 42 may be formed together with the contact holes 33 reaching the plugs 9 provided in the lower layer.

However, as described above, the contact holes 33 and the dummy contact holes 42 are formed at the same time, and annealing for removing moisture from the second interlayer insulating film 12 is then performed in some cases. In such a case, the annealing is performed in an atmosphere of an inert gas such as argon (Ar) in order to prevent the plugs 9 exposed on the bottom surface of the contact holes 33 from being oxidized.

A second embodiment will now be described.

Figure 13:
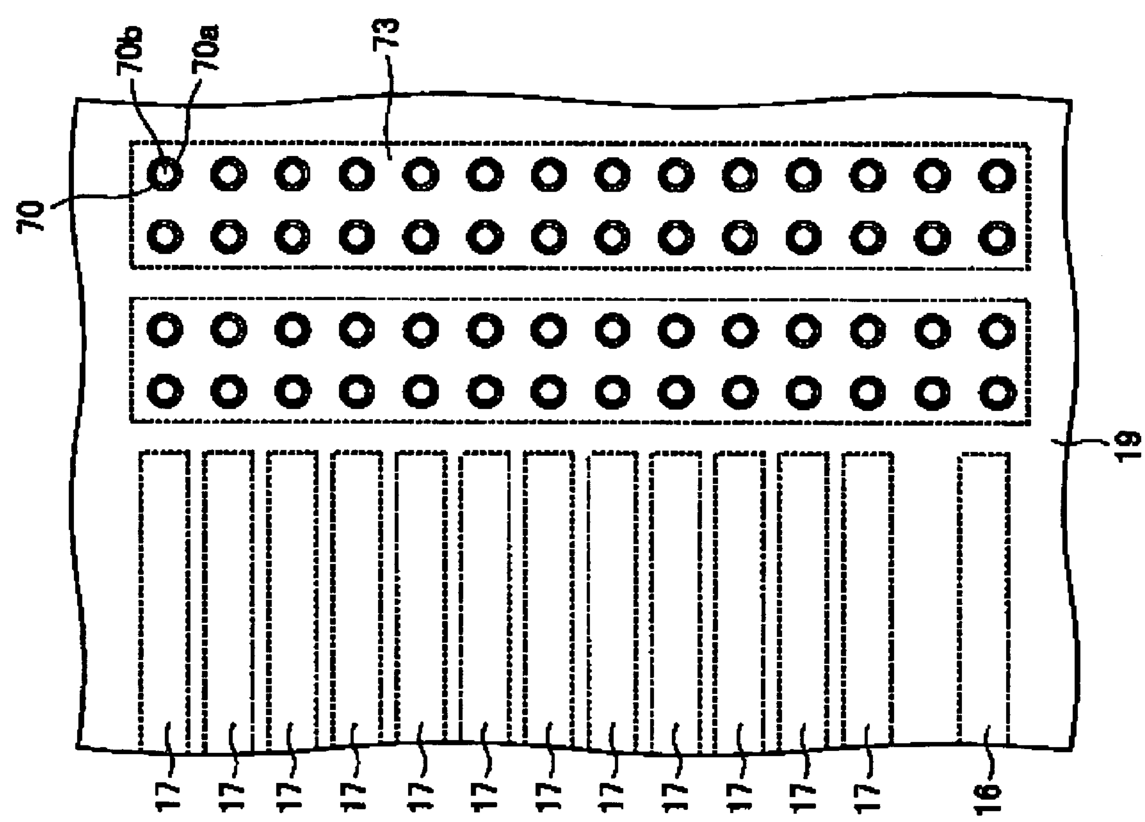
FIG. 13 is a schematic plan view of the relevant part of a layer disposed on the layer including the ferroelectric capacitors in the FeRAM according to the fourth embodiment.
Figure 14:
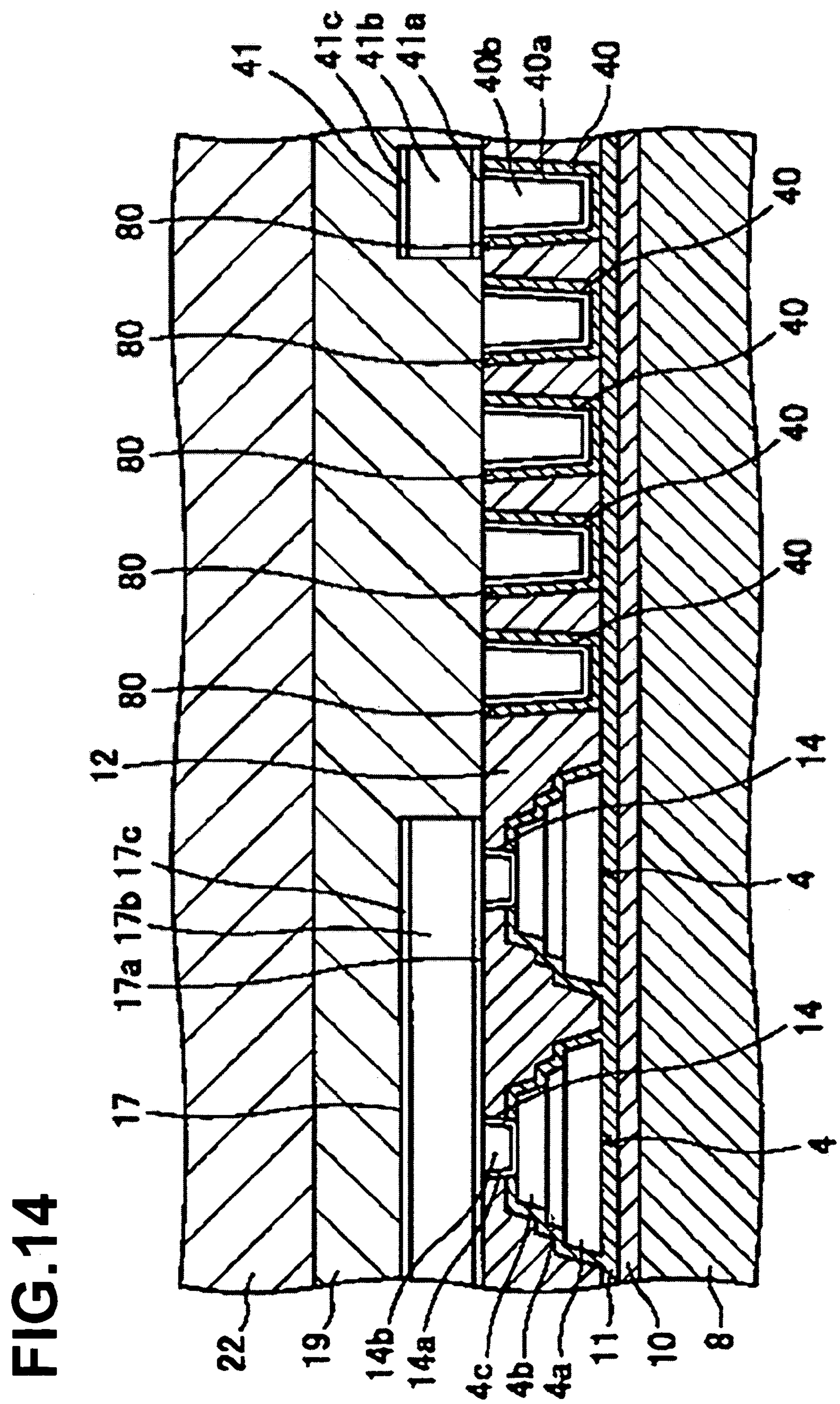
FIG. 14 is a schematic cross-sectional view of the relevant part showing an example of the structure near ferroelectric capacitors in an FeRAM according to a fifth embodiment.

FIG. 13 is a schematic cross-sectional view of the relevant part showing an example of the structure near ferroelectric capacitors in an FeRAM according to the second embodiment. FIG. 14 is a schematic plan view of the relevant part of a layer including the ferroelectric capacitors in the FeRAM according to the second embodiment.

As shown in FIGS. 13 and 14, in the FeRAM of the second embodiment, dummy plugs 50 in which a W film 50*b* is provided on a diffusion-preventing film 50*a* are provided near ferroelectric capacitors 4 as in the first embodiment. The FeRAM of the second embodiment differs from the FeRAM of the first embodiment in that a dummy lower electrode 51 is provided under each of the dummy plugs 50.

As in the first embodiment, this structure can decrease the volume of the second interlayer insulating film 12 by forming the dummy plugs 50 and the dummy lower electrodes 51. Accordingly, the degradation of the ferroelectric capacitors 4 caused by moisture and hydrogen can be effectively suppressed.

The dummy plugs 50 and the dummy lower electrodes 51 are preferably disposed in the vicinity of the ferroelectric capacitors 4. The diameter of the dummy plugs 50 can be appropriately determined in consideration of CMP performed during the formation of the dummy plugs 50.

Such an FeRAM including the dummy plugs 50 and the dummy lower electrodes 51 can be formed by, for example, the following method.

First, as shown in FIG. 2, ferroelectric capacitors 4 and an AlO film 11 are formed.

Figure 15A:
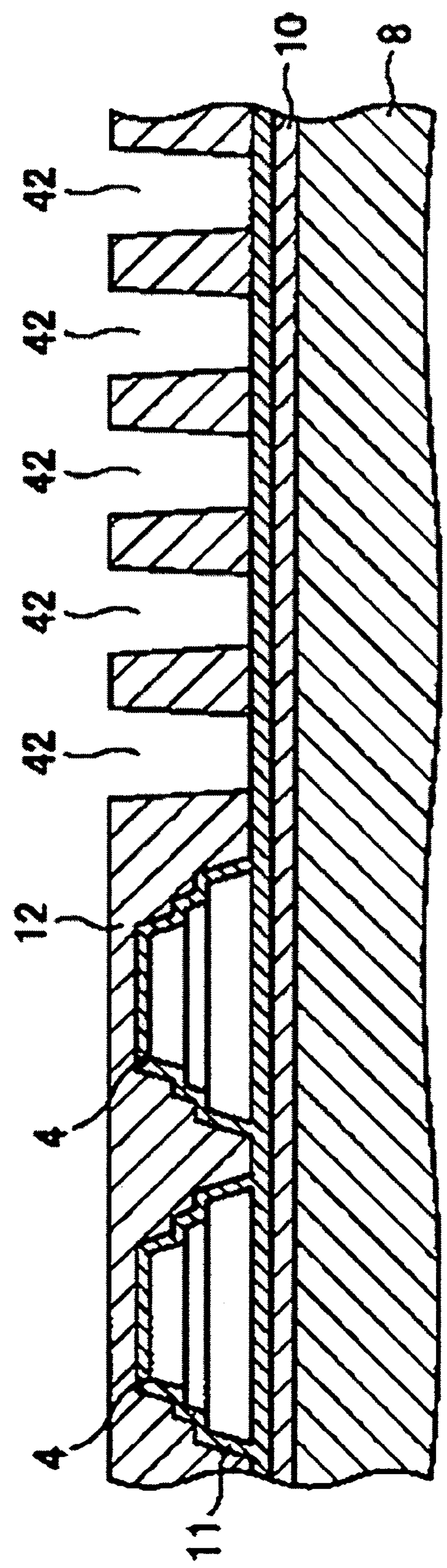
FIGS. 15A to 15B are schematic cross-sectional views of the relevant part showing a step of forming dummy contact holes according to the fifth embodiment.
Figure 15B:
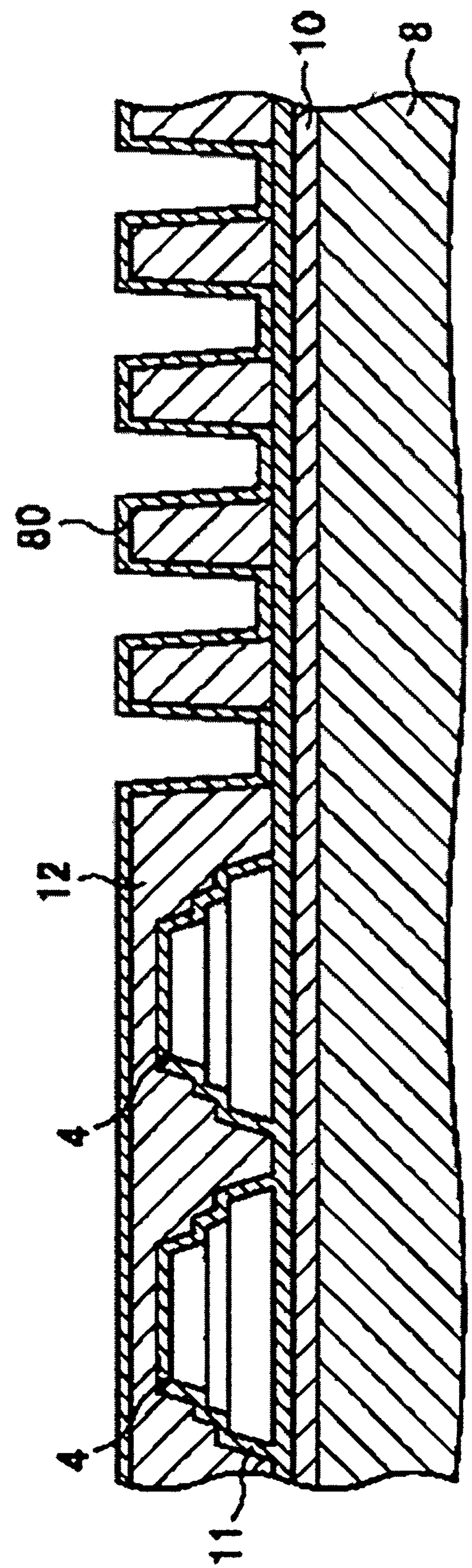

FIG. 15 is a schematic cross-sectional view of the relevant part after the ferroelectric capacitors of the second embodiment are formed.

In the step shown in FIG. 2, dummy lower electrodes 51 are formed at an end of the memory cell array, as shown in FIG. 15.

In order to obtain this structure, first, for example, a Pt film and a PZT film are sequentially deposited on the AlO film 11 disposed on an anti-oxidation film 10, and crystallization annealing is then performed. An IrO film is then deposited on the PZT film, and crystallization annealing is then performed. Furthermore, an IrO film is deposited thereon. Subsequently, the IrO film, the PZT film, and the Pt film are etched in three stages using separate masks. Thus, upper electrodes 4*c*, ferroelectric films 4*b*, and lower electrodes 4*a* are sequentially formed, thereby forming the ferroelectric capacitors 4.

In the second embodiment, in the formation of the ferroelectric capacitors 4, when the lower electrodes 4*a* are formed by etching the Pt film, the etching is performed so that the Pt film remains not only in the areas where the ferroelectric capacitors 4 are formed but also in peripheral areas thereof, as shown in FIG. 15. Accordingly, the dummy lower electrodes 51 are formed. An AlO film 11 is then deposited to cover the ferroelectric capacitors 4 and the dummy lower electrodes 51, thus obtaining the structure shown in FIG. 15.

After the steps shown in FIGS. 2 and 15, as shown in FIG. 3, a second interlayer insulating film 12 is formed, and contact holes 31 and 32 reaching the lower electrode 4*a* and the upper electrode 4*c* of the ferroelectric capacitors 4, respectively, are then formed.

Figure 16:
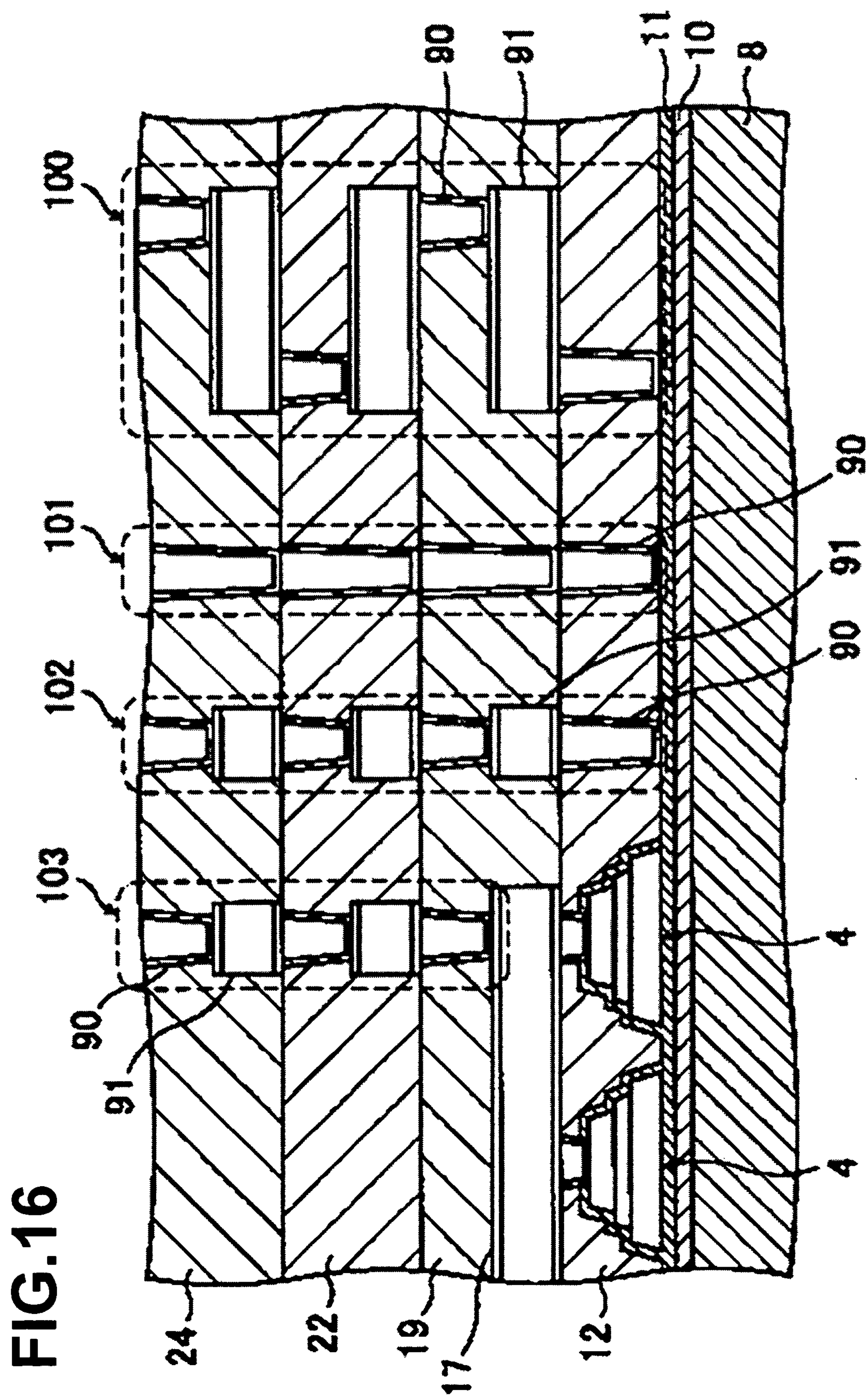
FIG. 16 is a view showing examples of continuous structures.

FIG. 16 is a schematic cross-sectional view of the relevant part showing a step of forming contact holes according to the second embodiment.

In the step described with reference to FIG. 3, as shown in FIG. 16, dummy contact holes 52 reaching the dummy lower electrodes 51 provided near the ferroelectric capacitors 4 are formed together with the contact holes 31 and 32 reaching the lower electrode 4*a* and the upper electrode 4*c*, respectively. The dummy contact holes 52 are formed together with the contact holes 31 and 32 by etching using the dummy lower electrodes 51 as an etching stopper.

After the contact holes 31 and 32, and the dummy contact holes 52 are formed as described above, predetermined recovery annealing is performed. By performing this recovery annealing, the characteristics of the ferroelectric capacitors 4 are recovered and moisture contained in the second interlayer insulating film 12 is removed through the contact holes 31 and 32, and the dummy contact holes 52.

The subsequent steps can be performed as in the first embodiment. Specifically, after the recovery annealing, first, contact holes 33 are formed as shown in FIG. 4. Subsequently, as shown in FIG. 5, the contact holes 31, 32, and 33 are filled, and the dummy contact holes 52 shown in FIG. 16 are also filled. Subsequently, by performing CMP, the plugs 13, 14, and 15 shown in FIG. 6 are formed, and the dummy plugs 50 shown in FIGS. 13 and 14 are formed at an end of the memory cell array. As shown in FIG. 6, a wiring 17 and the like are formed on the plug 14 and the like. As shown in FIG. 13, a wiring 53 having a structure in which a Ti/TiN film 53*a*, an AlCu film 53*b*, and a Ti/TiN film 53*c* are stacked is formed on the dummy plugs 50, as needed. Subsequently, as shown in FIG. 6, a third interlayer insulating film 19 is formed, and a plug 20 is then formed in the third interlayer insulating film 19, followed by the formation of the structures of the upper layers.

In the method described above, a mask having a pattern that can provide a resist pattern on which the lower electrodes 4*a* and the dummy lower electrodes 51 are formed at the same time after etching is used as a mask for forming a resist pattern in the formation of the lower electrodes 4*a* by etching. A mask having a pattern that can provide a resist pattern on which the contact holes 31 and 32 and the dummy contact holes 52 are formed at the same time after etching is used as a mask for forming a resist pattern in the formation of the contact holes 31 and 32 by etching.

By using these masks, the lower electrodes 4*a* and the dummy lower electrodes 51 can be formed at the same time. The contact holes 31 and 32, and the dummy contact holes 52 can also be formed at the same time. Furthermore, the contact holes 31 and 32, and the dummy contact holes 52 can be filled at the same time. Accordingly, an FeRAM in which the degradation of the ferroelectric capacitors 4 is suppressed can be formed without increasing the number of steps.

In addition, by forming the dummy contact holes 52 together with the contact holes 31 and 32, moisture can be efficiently removed from the second interlayer insulating film 12 during the recovery annealing of the ferroelectric capacitors 4. By forming the dummy plugs 50 and the dummy lower electrodes 51, the volume of the second interlayer insulating film 12 can be decreased. Accordingly, the degradation of the ferroelectric capacitors 4 can be effectively suppressed.

As in the first embodiment, the dummy contact holes 52 can be formed together with the contact holes 31 and 32 reaching the ferroelectric capacitors 4. Alternatively, after the contact holes 31 and 32 are formed, and the dummy contact holes 52 may be formed together with the contact holes 33 reaching the plugs 9. In this case, however, in order to prevent oxidation of the plugs 9, annealing for removing moisture from the second interlayer insulating film 12 is performed in an inert gas atmosphere.

A modification of the second embodiment will now be described.

FIG. 17 is a schematic plan view of the relevant part illustrating a modification of the second embodiment.

As shown in FIG. 14, dummy plugs 50 are provided on dummy lower electrodes 51. In addition, as shown in FIG. 17, dummy plugs 60 in which a W film 60*b* is provided on a diffusion-preventing film 60*a* can also be provided on lower electrodes 4*a* included in the ferroelectric capacitors 4.

Dummy contact holes for forming such dummy plugs 60 can be formed, for example, together with the dummy contact holes 52 reaching the dummy lower electrodes 51. That is, the dummy contact holes for forming the dummy plugs 60 can be formed together with the contact holes 31 and 32 reaching the ferroelectric capacitors 4. Alternatively, the dummy contact holes for forming the dummy plugs 60 can be formed together with the contact holes 33 reaching the plugs 9 provided in the lower layer. The dummy contact holes thus formed are filled together with the other holes, thereby forming the dummy plugs 60 on the on the lower electrodes 4*a* of the ferroelectric capacitors 4.

Since the volume of the second interlayer insulating film 12 near the ferroelectric capacitors 4 is also decreased in this structure, the degradation of the ferroelectric capacitors 4 can be suppressed.

Next, a third embodiment will be described.

FIG. 18 is a schematic cross-sectional view of the relevant part showing an example of the structure near ferroelectric capacitors in an FeRAM according to the third embodiment. FIG. 19 is a schematic plan view of the relevant part of a layer disposed on the layer including the ferroelectric capacitors in the FeRAM according to the third embodiment.

The FeRAM of the third embodiment differs from the FeRAM of the first embodiment in the following point. As shown in FIGS. 18 and 19, the FeRAM of the third embodiment includes dummy plugs 70 instead of the dummy plugs 40 of the first embodiment. The dummy plugs 70 are provided in a layer disposed on the layer including ferroelectric capacitors 4, i.e., in a first wiring layer. Each of the dummy plugs 70 includes a diffusion-preventing film 70*a* and a W film 70*b* provided on the diffusion-preventing film 70*a*. The FeRAM of the third embodiment includes an etching stopper film 71 under the dummy plugs 70.

This structure can decrease the volume of a third interlayer insulating film 19 including a wiring layer provided on the ferroelectric capacitors 4. Therefore, the degradation of the ferroelectric capacitors 4 caused by moisture and hydrogen can be effectively suppressed.

The dummy plugs 70 are preferably disposed in the vicinity of the ferroelectric capacitors 4. The diameter of the dummy plugs 70 can be appropriately determined in consideration of CMP performed during the formation of the dummy plugs 70.

The dummy plugs 70 can be formed together with the plugs 20 shown in FIGS. 1 and 6.

More specifically, first, as shown in FIG. 2, ferroelectric capacitors 4 and an AlO film 11 are formed, and as shown in FIG. 3, a second interlayer insulating film 12 is then formed. In this embodiment, an etching stopper film 71 is further formed on the second interlayer insulating film 12. The etching stopper film 71 is formed by, for example, depositing a SiON film having a thickness about 100 nm using a CVD method.

After the etching stopper film 71 is formed as described above, contact holes 31 and 32 reaching the ferroelectric capacitors 4 are formed as similarly shown in FIG. 3. Recovery annealing of the ferroelectric capacitors 4 is then performed. After the recovery annealing, contact holes 33 reaching the plugs 9 are formed as similarly shown in FIG. 4. Subsequently, the contact holes 31, 32, and 33 are filled as similarly shown in FIG. 5. CMP is then performed to form plugs 13, 14, and 15.

As similarly shown in FIG. 6, wirings 16, 17, and 18 are formed, a third interlayer insulating film 19 is formed, and a plug 20 connected to the wiring 18 is formed. In the formation of the plug 20, first, a contact hole for the plug 20 is formed in the third interlayer insulating film 19. Dummy contact holes for the dummy plugs 70 shown in FIGS. 18 and 19 are also formed at the same time. The contact hole and the dummy contact holes are then filled by a predetermined method, followed by CMP. Accordingly, the dummy plugs 70 shown in FIGS. 18 and 19 are formed together with the plug 20.

As regards the subsequent steps, the structures of the upper layers can be formed as in the first embodiment. As shown in FIG. 18, a wiring 72 may be formed on the dummy plugs 70, as needed. The wiring 72 has, for example, a structure in which a Ti/TiN film 72*a*, an AlCu film 72*b*, and a Ti/TiN film 72*c* are stacked. The wiring 72 can be formed, for example, together with the wiring 21 shown in FIG. 1.

A fourth embodiment will now be described.

FIG. 20 is a schematic cross-sectional view of the relevant part showing an example of the structure near ferroelectric capacitors in an FeRAM according to a fourth embodiment. FIG. 21 is a schematic plan view of the relevant part of a layer disposed on the layer including the ferroelectric capacitors in the FeRAM according to the fourth embodiment.

The FeRAM of the fourth embodiment differs from the FeRAM of the third embodiment in the following point. The FeRAM of the fourth embodiment includes a dummy wiring 73 under dummy plugs 70 instead of the etching stopper film 71 shown in FIGS. 18 and 19. The dummy wiring 73 has, for example, a structure in which a Ti/TiN film 73*a*, an AlCu film 73*b*, and a Ti/TiN film 73*c* are stacked.

The dummy wiring 73 can be formed together with the wiring 17 and the like formed in the same layer. The dummy plugs 70 can be formed together with the plug 20 as in the third embodiment.

Unlike the method of the third embodiment, this method does not require a step of forming the etching stopper film 71. Furthermore, in order to form such a dummy wiring 73 and the dummy plugs 70, it is sufficient that only mask patterns are changed. Therefore, the FeRAM having the structure shown in FIGS. 20 and 21 can be formed without increasing the number of steps.

The structures of the upper layers can be formed as in the first embodiment. As shown in FIG. 20, a wiring 74 may be formed on the dummy-plugs 70, as needed. The wiring 74 has, for example, a structure in which a Ti/TiN film 74*a*, an AlCu film 74*b*, and a Ti/TiN film 74*c* are stacked. The wiring 74 can be formed together with the wiring 21 shown in FIG. 1.

In this embodiment, a dummy wiring 73 is provided, and the dummy plugs 70 are provided on the dummy wiring 73. Alternatively, the dummy plugs 70 may be provided on the wiring 17.

A fifth embodiment will now be described.

FIG. 22 is a schematic cross-sectional view of the relevant part showing an example of the structure near ferroelectric capacitors in an FeRAM according to a fifth embodiment.

The FeRAM of the fifth embodiment differs from the FeRAM of the first embodiment in the following point. Specifically, in the FeRAM of the fifth embodiment, dummy plugs 40 are provided in dummy contact holes each covered with an AlO film 80.

In the FeRAM of the fifth embodiment having the above structure, the volume of a second interlayer insulating film 12 can be decreased as in the first embodiment. In addition, the presence of an AlO film 11 covering the ferroelectric capacitors 4 and the AlO film 80 covering the dummy plugs 40 can suppress the intrusion of moisture and hydrogen more effectively.

The FeRAM having the above structure can be formed by, for example, a method below.

FIG. 23 is a schematic cross-sectional view of the relevant part showing a step of forming the dummy contact holes according to the fifth embodiment.

First, as shown in FIG. 23, dummy contact holes 42 are formed by etching in the second interlayer insulating film 12 near the ferroelectric capacitors 4. Predetermined annealing is then performed, thereby removing moisture from the second interlayer insulating film 12 through the dummy contact holes 42.

FIG. 24 is a schematic cross-sectional view of the relevant part showing a step of forming an AlO film according to the fifth embodiment.

After the annealing, an AlO film 80 is formed on the entire surface. The AlO film 80 can be formed by, for example, a sputtering method or an MOCVD method. The method of forming the AlO film 80 is appropriately selected in accordance with the thickness thereof, the size of the dummy contact holes 42, the angle of the sidewalls, and the like.

After the AlO film 80 is formed as described above, the subsequent steps are performed as the steps of forming the above-described basic structure of the FeRAM. First, as similarly shown in FIG. 3, contact holes 31 and 32 reaching the ferroelectric capacitors 4 are formed. Subsequently, recovery annealing of the ferroelectric capacitors 4 is performed. After the recovery annealing, as similarly shown in FIG. 4, contact holes 33 reaching the plugs 9 are formed. Subsequently, as similarly shown in FIG. 5, the contact holes 31, 32, and 33 are filled, and CMP is then performed. Thus, plugs 13, 14, and 15 are formed. Subsequently, as similarly shown in FIG. 6, wirings 16, 17, and 18 are formed, a third interlayer insulating film 19 is formed, and a plug 20 is formed. The structures of the upper layer are formed as in the above embodiments. As shown in FIG. 22, a wiring 41 may be formed on the dummy plugs 40, as needed.

In the above method, it is necessary to form the dummy contact holes 42 in a step separate from the steps of forming the contact holes 31, 32, and 33. In addition, the annealing for removing moisture in the second interlayer insulating film 12 and the recovery annealing of the, ferroelectric capacitors 4 must be separately performed. However, an FeRAM in which the degradation caused by moisture and hydrogen is effectively suppressed can be formed by this method.

The above method of covering the periphery of the dummy plugs 40 with the AlO film 80 can be similarly applied to the dummy plugs 50, 60, and 70 of the second to fourth embodiments described above.

The first to fifth embodiments have been described. A plurality of structures described in the first embodiment to the fifth embodiment may be applied to a multilayer structure constituting an FeRAM in combinations. However, in some multilayer structures of an FeRAM, a plug, a dummy plug, a wiring, and a dummy wiring are continuously disposed from near a ferroelectric capacitor to the top wiring layer. It should be noted that such a multilayer structure can be a pathway of intrusion of moisture and hydrogen.

FIG. 25 is a view showing examples of continuous structures.

For example, as shown in FIG. 25, continuous structures 100, 101, 102, and 103 are arranged at positions ranging from near a ferroelectric capacitor 4 to a top wiring layer.

In FIG. 25, the continuous structures 100 and 102 each have a structure in which dummy plugs 90 and dummy wirings 91 are alternately connected to each other from the layer including the ferroelectric capacitor 4 to the top wiring layer. The continuous structure 101 has a structure in which dummy plugs 90 are connected to each other from the layer including the ferroelectric capacitor 4 to the top wiring layer. The continuous structure 103 has a structure in which dummy plugs

90 and dummy wirings 91 are alternately connected to each other from a wiring 17 connected to the ferroelectric capacitor 4 to the top wiring layer.

A multilayer structure of an FeRAM may include at least one of the continuous structures 100, 101, 102, and 103. In such a case, for example, boundaries between a dummy plug 90 or a dummy wiring 91 and a second interlayer insulating film 12, a third interlayer insulating film 19, a fourth interlayer insulating film 22, or a fifth interlayer insulating film 24 can be a pathway in which moisture and hydrogen enter in the vicinity of the ferroelectric capacitor 4.

Accordingly, the FeRAM is preferably formed in consideration of the continuous structures 100, 101, 102, and 103.

The structures (the number of layers, the positions of elements, the materials, the film thicknesses, the methods of forming the layers, and the like) of the FeRAM described above are not limited to the above and can be appropriately changed in accordance with the required characteristics of the FeRAM to be produced.

For example, in the above description, an AlO film is used as a film for blocking moisture and hydrogen. Alternatively, instead of the AlO film, another moisture-resistant insulating film, such as a titanium oxide (TiO) film, a silicon nitride (SiN) film, a silicon oxynitride (SiON) film, a boron nitride (BN) film, a silicon carbide (SiC) film, or a carbon (C) film can be used. Instead of the W film, an Al film may be used for the plugs. Instead of the Ti film and the TiN film, a tantalum (Ta) film and a tantalum nitride (TaN) film may be used for the diffusion-preventing films of the plugs.

In the above description, wirings including an AlCu film as a main layer are formed. Alternatively, a Cu wiring for a circuit or a dummy Cu wiring may be formed in each interlayer insulating film using a damascene process. Alternatively, a Cu wiring for a circuit or a dummy Cu wiring and a Cu plug may be formed at the same time in each interlayer insulating film using a dual damascene process.

Cases where the structure of the embodiments is applied to an FeRAM having a planar structure have been described as examples. However, the embodiments can be similarly applied to an FeRAM having another structure such as a stack structure.

What is claimed is:

1. A semiconductor device manufacturing method having a ferroelectric capacitor having a ferroelectric film comprising:

forming a first interlayer insulating film above a semiconductor substrate;

forming an anti-oxidation film above the first interlayer insulating film;

forming the ferroelectric capacitor above the anti-oxidation film, the anti-oxidation film being provided under the entire bottom surface of the ferroelectric capacitor;

forming a first moisture-resistant insulating film on the ferroelectric capacitor;

forming a second interlayer insulating film having a multilayer structure over the first and second moisture-resistant insulating films;

forming a dummy contact hole in the second interlayer insulating film;

forming a contact hole in the second interlayer insulating film and the second moisture-resistant insulating film; and forming a dummy plug in the dummy contact hole filling a conductive material and a plug for electrical connection filling the conductive material in the contact hole.

2. The semiconductor device manufacturing method according to claim 1, wherein the second interlayer insulating film includes a first layer formed on the ferroelectric capacitor, and the dummy contact hole is formed in the first layer.

3. The semiconductor device manufacturing method according to claim 2, further comprising:

forming a dummy lower electrode and a lower electrode of the ferroelectric capacitor before forming the second interlayer insulating film.

4. The semiconductor device manufacturing method according to claim 3, wherein the dummy contact hole is formed reaching the dummy lower electrode, and the contact hole is formed reaching the ferroelectric capacitor.

5. The semiconductor device manufacturing method according to claim 2, further comprising:

forming the ferroelectric capacitor before forming the second interlayer insulating film;

wherein the dummy contact hole is formed reaching the lower electrode of the ferroelectric capacitor, and the contact hole is formed reaching the ferroelectric capacitor.

6. The semiconductor device manufacturing method according to claim 1, wherein the second interlayer insulating film includes a first layer formed on the ferroelectric capacitor, a second layer formed over the first layer, and the dummy contact hole is formed in the second layer.

7. The semiconductor device manufacturing method according to claim 6, further comprising:

forming a wiring and a dummy wiring covered with the second layer.

8. The semiconductor device manufacturing method according to claim 7, the dummy contact hole is formed reaching the dummy wiring, and the contact hole is formed reaching the wiring.

9. The semiconductor device manufacturing method according to claim 6, wherein the dummy contact hole is formed together with the contact hole.

10. The semiconductor device manufacturing method according to claim 1, further comprising:

forming a second moisture-resistant insulating film above the anti-oxidation film.

11. A semiconductor device manufacturing method having a ferroelectric capacitor having a ferroelectric film comprising:

forming a first interlayer insulating film above a semiconductor substrate;

forming an anti-oxidation film above the first interlayer insulating film;

forming the ferroelectric capacitor above the anti-oxidation film, the anti-oxidation film being provided under the entire bottom surface of the ferroelectric capacitor;

forming a first moisture-resistant insulating film on the ferroelectric capacitor;

forming a second interlayer insulating film over the first and second moisture-resistant insulating films;

forming a contact hole in the second interlayer insulating layer and the second moisture-resistant insulating film;

forming a plug for electrical connection filling a conductive material in the contact hole;

forming a third interlayer insulating film over the second interlayer insulating film;

forming a dummy contact hole in the third interlayer insulating film; and forming a dummy plug filling the conductive material in the dummy contact hole.

12. The semiconductor device manufacturing method according to claim 8, further comprising:

annealing the third interlayer insulating film after forming the dummy contact hole.

13. The semiconductor device manufacturing method according to claim 7, wherein the dummy wiring is formed on the dummy plug after forming the dummy plug and the plug.

14. The semiconductor device manufacturing method according to claim 9, further comprising:

forming a wiring trench which overlaps a part of the contact hole or/and the dummy contact hole, and filling the wiring trench with the conductive material.

15. The semiconductor device manufacturing method according to claim 11, further comprising:

forming a second moisture-resistant insulating film above the anti-oxidation film.

* * * * *